(12) United States Patent
Iwatsuki

(10) Patent No.: US 8,719,659 B2
(45) Date of Patent: May 6, 2014

(54) STORAGE APPARATUS AND FAULT DIAGNOSIS METHOD

(75) Inventor: Ryuji Iwatsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 394 days.

(21) Appl. No.: 13/067,445

(22) Filed: Jun. 1, 2011

(65) Prior Publication Data

US 2011/0239090 A1 Sep. 29, 2011

Related U.S. Application Data

(63) Continuation of application No. PCT/JP2008/072029, filed on Dec. 4, 2008.

(51) Int. Cl.
*G11C 29/42* (2006.01)

(52) U.S. Cl.
USPC .......................................... 714/763

(58) Field of Classification Search
CPC ........................ G11C 29/42; G11C 29/56008
USPC ............................................... 714/763, 768
See application file for complete search history.

(56) References Cited

U.S. PATENT DOCUMENTS

| | | | | |
|---|---|---|---|---|
| 4,296,494 A | * | 10/1981 | Ishikawa et al. | 714/6.1 |
| 5,384,789 A | * | 1/1995 | Tomita | 714/755 |
| 5,933,436 A | * | 8/1999 | Tanzawa et al. | 714/762 |
| 7,043,679 B1 | * | 5/2006 | Keltcher et al. | 714/763 |
| RE39,253 E | * | 8/2006 | Katayama et al. | 714/763 |
| 7,272,773 B2 | * | 9/2007 | Cargnoni et al. | 714/763 |
| 7,530,005 B2 | * | 5/2009 | Satori et al. | 714/763 |
| 7,779,333 B2 | * | 8/2010 | Taito et al. | 714/763 |
| 7,877,667 B2 | * | 1/2011 | Origasa et al. | 714/763 |

FOREIGN PATENT DOCUMENTS

| | | |
|---|---|---|
| JP | 1-309154 | 12/1989 |
| JP | 05-101698 | 4/1993 |
| JP | 5-165734 | 7/1993 |
| JP | 2002-042493 | 2/2002 |
| JP | 2006-208077 | 8/2006 |

OTHER PUBLICATIONS

Patent Abstracts of Japan, Publication No. 01-309154, Published Dec. 13, 1989.
Patent Abstracts of Japan, Publication No. 05-165734, Published Jul. 2, 1993.
Patent Abstracts of Japan, Publication No. 2006-208077, Published Aug. 10, 2006.

(Continued)

*Primary Examiner* — James C Kerveros
(74) *Attorney, Agent, or Firm* — Staas & Halsey LLP

(57) ABSTRACT

In a storage apparatus: a write-address counter outputs a write address; an input-data inverter inverts input data to be inputted into a storage unit; an input-data selector selects one of the input data and the inverted input data on the basis of one or more first bits constituting the write address, and writes the one of the input data and the inverted input data in the storage unit on the basis of one or more second bits constituting the write address; a read-address counter outputs the read address; an output-data inverter inverts output data outputted from the storage unit on the basis of one or more third bits constituting the read address; and an output-data selector selects and outputs one of the output data and the inverted output data on the basis of one or more fourth bits constituting the read address.

9 Claims, 13 Drawing Sheets

(56) References Cited

OTHER PUBLICATIONS

Patent Abstracts of Japan, Publication No. 05-101698, Published Apr. 23, 1993.

Int'l Search Report mailed Aug. 18, 2009 in PCT/JP2008/072029.
Japanese Office Action issued Jan. 22, 2013 in corresponding Japanese Patent Application No. 2010-541173.
Patent Abstract of Japan Publication No. 2002-042493, published Feb. 8, 2002.

* cited by examiner

FIG. 8

| Inversion Inhibition Flag | address[9] (Inversion Control Flag) | address[8] | address[0] (LSB) | Necessity of Inversion |
|---|---|---|---|---|
| 1 | - | - | - | No Inversion |
| 0 | 0 | 0 | 0 | No Inversion |
| | | | 1 | No Inversion |
| | | 1 | 0 | Inversion |
| | | | 1 | Inversion |
| | 1 | 0 | 0 | No Inversion |
| | | | 1 | Inversion |
| | | 1 | 0 | Inversion |
| | | | 1 | No Inversion |

FIG. 13

| Inversion Inhibition Flag | Inversion Control Counter | address[0](LSB) | Necessity of Inversion |
|---|---|---|---|
| 1 | - | - | No Inversion |
| 0 | 00b | 0 | No Inversion |
| | | 1 | No Inversion |
| | 01b | 0 | Inversion |
| | | 1 | Inversion |
| | 10b | 0 | No Inversion |
| | | 1 | Inversion |
| | 11b | 0 | Inversion |
| | | 1 | No Inversion |

STORAGE APPARATUS AND FAULT DIAGNOSIS METHOD

This application is a continuing application, filed under 35 U.S.C. Section 111(a), of International Application PCT/JP2008/072029, filed Dec. 4, 2008.

FIELD

The embodiments discussed herein relate to a storage apparatus and a fault diagnosis method.

BACKGROUND

In design and manufacture of an LSI (Large Scale Integration), various tests are performed before the products are put into the market. For example, a mass-production test and a POST (Power On Self Test) are known as tests which are performed by mounting an LSI on a device such as a computer. In such tests, a diagnosis as to whether or not an LSI is normally operating is made by executing a test program in a testing device on which the LSI is mounted.

However, many LSIs have FIFO (First-In First-Out) type storage devices. In the FIFO type storage devices, data which are earlier inputted are earlier outputted. Hereinafter, buffer circuits in which input/output control is performed in a first-in first-out manner are referred to as FIFOs. The FIFOs are constituted by flip flop circuits or a RAM (random access memory), and used in various portions of LSIs, for example, as a packet transmission queue, a packet reception queue, or as a memory for temporarily storing control information. In the case where an error correction code (ECC) generated by hardware is attached to data at each address in a FIFO, the data is protected on an address-by-address basis.

The testing of an LSI having a FIFO includes an operational test of the FIFO. For example, a fault diagnosis of the FIFO is performed by inputting predetermined data into the LSI in accordance with a test program for a mass-production test or a POST. The fault detection in the FIFO memory is performed on the basis of both of disparity between an expected value and a value obtained by execution of the test program and detection of an ECC error.

The faults detected by execution of the tests of the FIFOs include permanent faults and delay faults. The permanent fault means a state in which the value of a bit in a FIFO is stuck at "0" or "1" because of short circuit in the wiring or the like. For example, in the case where a permanent fault in which a bit value is stuck at "0" occurs at a bit in a FIFO, the value of the bit remains "0" even when the value "1" is written in the bit. Therefore, in order to detect both of the permanent fault in which the value of a bit is stuck at "0" and the permanent fault in which the value of the bit is stuck at "1", the test program is required to generate a test pattern which writes each of the values "0" and "1" in the bit. The delay fault means a failure in readout from a FIFO which is caused by an excessive delay beyond the operational cycle. For example, in order to detect a delay fault in an address, the test program needs to contain a test pattern in which the value of data in the address is different from the value of data in the preceding address, e.g., the value of the test data in the address needs to be "1" and the value of the test data in the preceding address needs to be "0". (See, for example, Japanese Laid-open Patent Publications Nos. 01-309154, 05-165734, and 2006-208077.)

However, in some case, it is difficult to write an arbitrary test pattern in a FIFO. For example, in the case where both of a header and data of a packet are written in a FIFO, arbitrary values can be written in the data area by a test program. However, the fields constituting the header area respectively have meanings such as address and type. Therefore, a test program needs to be produced on the basis of the recognition as to how the respective fields are written in the FIFO. In addition, in the case where the data written in the FIFO contains the ECC, the test program needs to be produced on the basis of the recognition of the generator polynomial of the ECC. That is, in order to improve the fault detection rate, the test program needs to be produced on the basis of full knowledge of complex hardware logic circuitry so that the test program generates a desired test pattern.

Alternatively, it is possible to improve the fault detection rate as much as possible by producing a test pattern generating a long random pattern without knowledge of complex hardware logic circuitry. However, execution of the test program generating a long test pattern on respective LSIs during mass-production lowers the manufacturing efficiency, so that the use of the long random pattern is not realistic. Thus, it is impossible to achieve a high fault detection rate in the case where production of a test pattern for a FIFO based on full knowledge of complex hardware logic circuitry is difficult or in the case where diagnosis of a FIFO by use of a long random pattern is difficult.

As explained above, in some cases, although the fault detection rate in detection of the permanent fault and the delay fault in a FIFO depends on a test pattern generated by a test program, data to be written in the FIFO may not be directly produced by the test program, so that it is difficult to achieve a high fault detection rate.

Incidentally, LIFO (Last-in First-out), as well as FIFO, is also known as a manner of writing and reading data in a predetermined order. According to LIFO, data which are later inputted are earlier outputted. Hereinafter, buffer circuits in which input/output control is performed in a last-in first-out manner are referred to as LIFOs. In LIFOs, as in FIFOs, a high fault detection rate may not be achieved because it is difficult to write an arbitrary test pattern in LIFOs.

SUMMARY

According to an aspect of the present invention, a storage apparatus which can hold and output data written in the storage apparatus is provided. The storage apparatus includes: a storage unit which has a plurality of entry areas, and in which data can be written on the basis of one or more bits constituting a write address designating one of the plurality of entry areas, and from which data can be read out on the basis of one or more bits constituting a read address designating one of the plurality of entry areas; a write-address counter which outputs the write address; an input-data inverter which inverts input data to be inputted into the storage unit, and outputs the inverted input data; an input-data selector which selects one of the input data and the inverted input data on the basis of one or more first bits constituting the write address, and writes the one of the input data and the inverted input data in the storage unit on the basis of one or more second bits constituting the write address; a read-address counter which outputs the read address; an output-data inverter which inverts output data outputted from the storage unit on the basis of one or more third bits constituting the read address, and outputs the inverted output data; and an output-data selector which selects and outputs one of the output data and the inverted output data on the basis of one or more fourth bits constituting the read address.

The objects and advantages of the invention will be realized and attained by means of the elements and combinations particularly pointed out in the claims.

It is to be understood that both the forgoing general description and the following detailed description are exemplary and explanatory and are not restrictive of the invention, as claimed.

BRIEF DESCRIPTION OF DRAWINGS

FIG. 8 indicates examples of inputs into and outputs from each inversion controller in the first embodiment;

FIG. 13 illustrates examples of inputs into and outputs from an inversion controller in the second embodiment.

DESCRIPTION OF EMBODIMENTS

The embodiments will be explained below with reference to the accompanying drawings, wherein like reference numbers refer to like elements throughout.

1. Outline of Storage System

Figure 1:
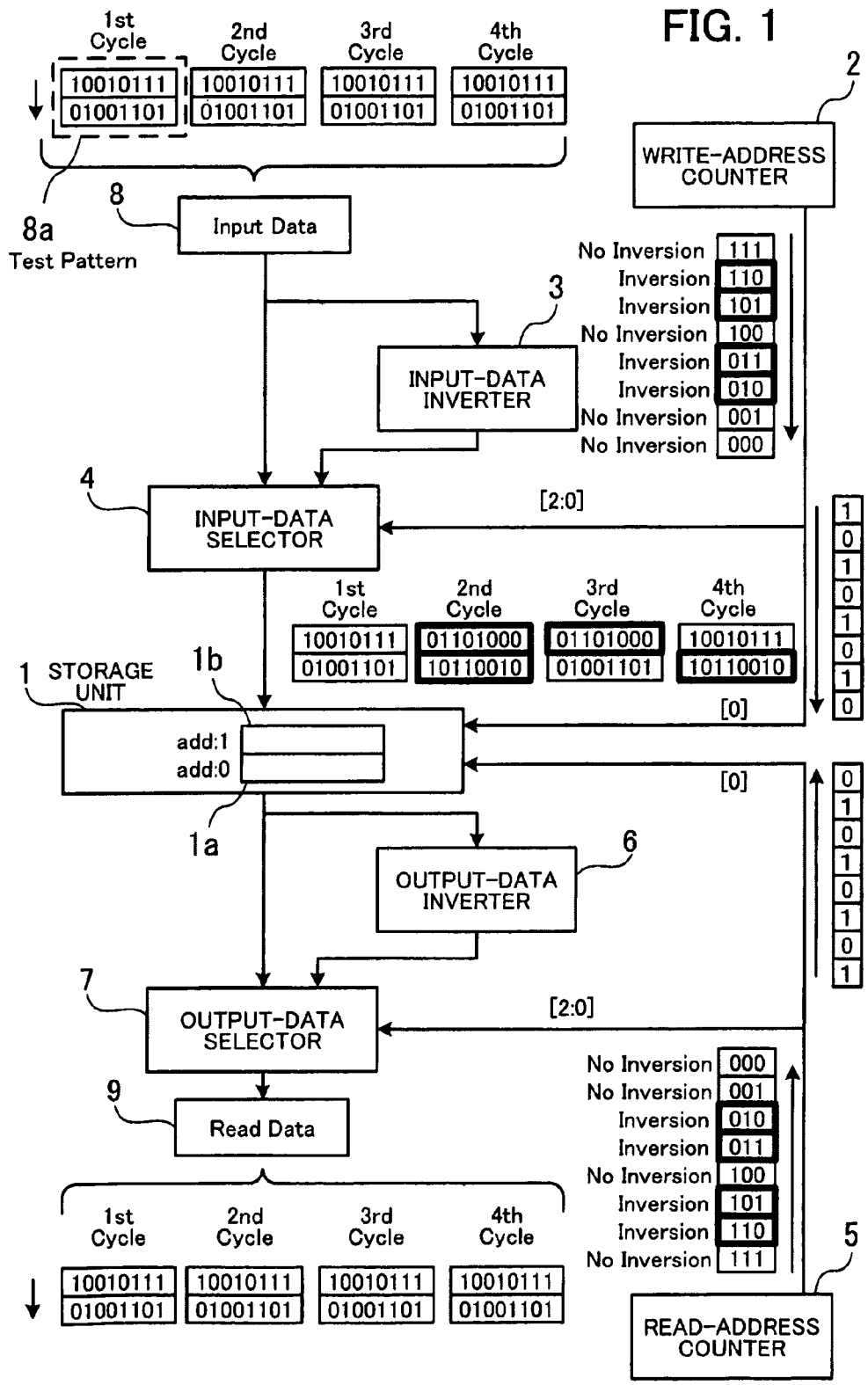
FIG. 1 illustrates an outline of techniques in the embodiments.

FIG. 1 illustrates an outline of techniques in embodiments. FIG. 1 illustrates an outline of a data input/output circuit arranged in a storage apparatus. The data input/output circuit in the storage apparatus includes a storage unit 1, a write-address counter 2, an input-data inverter 3, an input-data selector 4, a read-address counter 5, an output-data inverter 6, and an output-data selector 7.

The storage unit 1 includes a plurality of entry areas including the entry areas 1a and 1b. (In the following explanations, the storage unit 1 is assumed to include only the entry areas 1a and 1b for simple illustration.) Addresses are allocated to the entry areas 1a and 1b, respectively. In the example of FIG. 1, the addresses allocated to the entry areas 1a and 1b are assumed to be "0" and "1", respectively. Data is written in one of the entry areas 1a and 1b in the storage unit 1 on the basis of bits included in an address designating the one of the entry areas in which the data is to be written. In addition, data is read out from one of the entry areas 1a and 1b in the storage unit 1 on the basis of bits included in an address designating the one of the entry areas from which the data is to be read.

The write-address counter 2 outputs a write address to the storage unit 1. The number of bits which the write-address counter 2 has is two bits greater than the number of bits needed for designating all the addresses of the plurality of entry areas (including the entry areas 1a and 1b) in the storage unit 1. In the example of FIG. 1 (in which the storage unit 1 is assumed to include only the entry areas 1a and 1b), the write-address counter 2 outputs only the value of the least significant bit (LSB) in the write-address counter 2 to the storage unit 1. The excessive two bits are control bits for controlling inversion of input data 8, which is inputted into the storage unit 1.

The input-data inverter 3 inverts the input data 8, and outputs the inverted input data. The inversion of the input data 8 is realized by change of the value of each bit of the input data 8 into the inverted value. That is, the inversion changes the value "0" to "1" and the value "1" to "0" in the input data 8.

The input-data selector 4 selects the input data or the inverted input data according to one or more bits contained in the write address, and writes the selected data in the storage unit 1 according to one or more bits contained in the write address.

The read-address counter 5 outputs a read address to the storage unit 1. The number of bits which the read-address counter 5 has is two bits greater than the number of bits needed for designating all the addresses of the plurality of entry areas (including the entry areas 1a and 1b) in the storage unit 1. In the example of FIG. 1 (in which the storage unit 1 is assumed to include only the entry areas 1a and 1b), the read-address counter 5 outputs only the value of the least significant bit (LSB) in the read-address counter 5 to the storage unit 1. The excessive two bits are control bits for controlling inversion of output data, which is outputted from the storage unit 1.

The output-data inverter 6 inverts the output data from the storage unit 1, and outputs the inverted output data.

The output-data selector 7 reads the output data from the storage unit 1 according to one or more bits contained in the read address, selects the output data or the inverted output data according to one or more bits contained in the read address, and outputs the selected data as read data 9.

When fault diagnosis of the entry areas 1a and 1b in the storage unit 1 is performed in the storage apparatus having the above data input/output circuit, an operation of inputting data of a test pattern 8a (prepared in advance) is repeated four times (in four input cycles). The amount of the data of the test pattern 8a corresponds to the storage capacity of the storage unit 1. The data of the test pattern 8a is inputted in units of the data length corresponding to the storage capacity of each of the entry areas 1a and 1b. In the example of FIG. 1, the storage capacity of each of the entry areas 1a and 1b is eight bits (one byte), and the two-byte test pattern 8a constituting the input data 8 is inputted byte by byte.

The initial value of the write-address counter 2 is "000". Every time a unit amount of data constituting the input data 8 is inputted into the storage unit 1, the count in the write-address counter 2 is incremented. Every time the count in the write-address counter 2 is incremented, the value of the least significant bit (LSB) is alternately changed between "0" and "1". In the example of FIG. 1 (in which the storage unit 1 is assumed to include only the entry areas 1a and 1b), the LSB of the write-address counter 2 indicates the address of each entry area. Therefore, in the example of FIG. 1, each unit amount of data is alternately written in the entry areas 1a and 1b (respectively having the addresses "0" and "1"). The data to be written in each entry area is selected by the input-data selector 4. The input-data selector 4 can recognize the input cycle number of each of the repeated operations of inputting the data of the test pattern 8a, on the basis of the two relatively significant bits of the write-address counter 2. Specifically, the two relatively significant bits of the write-address counter 2 are "00" in the first input cycle, "01" in the second input cycle, "10" in the third input cycle, and "11" in the fourth input cycle. Thus, the input-data selector 4 selects and outputs, in the first to fourth input cycles, four different combinations of noninverted data and inverted data from the pair of entry areas from which data are to be read out in succession. In FIG. 1, the inverted input data and the write address and the read address which are regarded as selecting the inverted input data are indicated in bold frames.

In the first input cycle, the input-data selector 4 selects noninverted input data as data to be written in each of the entry areas 1a and 1b. In the second input cycle, the input-data selector 4 selects inverted input data as data to be written in each of the entry areas 1a and 1b. In the third input cycle, the input-data selector 4 selects noninverted input data as data to be written in the entry area 1a, and inverted input data as data to be written in the entry area 1b. In the fourth input cycle, the input-data selector 4 selects inverted input data as data to be written in the entry area 1a, and noninverted input data as data to be written in the entry area 1b.

In parallel with the input of the test pattern 8a, the data written in the entry areas 1a and 1b in the storage unit 1 are read out in succession. Each entry area from which the data is to be read out is designated by a bit outputted from the read-address counter 5. The initial value of the read-address counter 5 is "000", and the count of the read-address counter 5 is incremented every time data is read out from the storage unit 1. When the count of the read-address counter 5 is incremented, the value of the least significant bit (LSB) is alternately changed between "0" and "1". The LSB of the read-address counter 5 indicates the address of each entry area from which data is to be read out. Therefore, data is read out alternately from the entry area 1a corresponding to the address "0" and the entry area 1a corresponding to the address "1".

The data outputted from each entry area (from which the data is to be read out) is outputted to the output-data selector 7 and the output-data inverter 6. The output-data inverter 6 inverts the data from the entry area, and outputs the inverted output data to the output-data selector 7. The output-data selector 7 selects as the read data 9 the output data outputted from the entry area or the inverted output data outputted from the output-data inverter 6. The output-data selector 7 can recognize the input cycle number of each of the repeated operations of inputting the data of the test pattern 8a, on the basis of the two relatively significant bits of the read-address counter 5. That is, the two relatively significant bits of the read-address counter 5 are "00" in the first input cycle, "01" in the second input cycle, "10" in the third input cycle, and "11" in the fourth input cycle. Thus, the output-data selector 7 selects noninverted output data or inverted output data form the pair of entry areas (from which data are to be read out in succession) so that the four different combinations of noninverted output data and inverted output data (which are respectively identical to the four different combinations of noninverted output data and inverted output data selected by the input-data selector 4) are outputted in the first to fourth output cycles corresponding to the first to fourth input cycles. That is, when data to be read out is written in the storage unit 1 in the noninverted form, the output-data selector 7 selects the (noninverted) data outputted from the storage unit 1. When the data to be read out is written in the storage unit 1 in the inverted form, the output-data selector 7 selects the (inverted) data outputted from the output-data inverter 6. Therefore, unless a permanent fault or a delay fault occurs in the storage unit 1, the read data 9 outputted from the output-data selector 7 in the first to fourth output cycles becomes identical to the inputted test pattern 8a. In other words, if the read data 9 outputted from the output-data selector 7 in the first to fourth output cycles is different from the inputted test pattern 8a, it is possible to recognize that a permanent fault or a delay fault occurs in the storage unit 1.

In the above operations of the data input/output circuit, in order to detect the permanent fault, the values "0" or "1" is written in every bit constituting the entry areas 1a and 1b during the four input cycles. In the example of FIG. 1, the value written in each bit in the entry areas 1a and 1b in the second input cycle is the inversion of the value written in the bit in the first input cycle. Therefore, the operations of writing and reading the data in the first and second input and output cycles enable detection of a permanent fault in any bit in the entry areas 1a and 1b in the storage unit 1. In addition, in order to detect the delay fault, the values of each pair of corresponding bits in the entry areas 1a and 1b (i.e., the pair of the i-th bit in the entry area 1a and the i-th bit in the entry area 1b, where is an integer satisfying $0 \leq i \leq 7$), which are to be read out in succession, are arranged so that both of the transition from "0" to "1" and the transition from "1" to "0" occur when the corresponding bits are successively read during the first to fourth output cycles. If a delay fault occurs in a transition between the values of a pair of corresponding bits in the entry areas 1a and 1b, an error is detected in one of the values of the successive bits which is read out later.

In the first to fourth input cycles, the four different combinations of noninverted data and inverted data are produced by the input-data inverter 3 and the input-data selector 4 for the pair of entry areas from which data are to be read out in succession. Specifically, each pair of corresponding bits in the entry areas 1a and 1b which are to be read out in succession take on the values of "0" and "0", "1" and "1", "0" and "1", and "1" and "0" during the first to fourth input and output cycles regardless of the values of the bits constituting the test pattern 8a. That is, each of the transition from "0" to "1" and the transition from "1" to "0" necessarily occurs during the first to fourth input and output cycles. Therefore, it is possible to detect a delay fault which can occur in a transition between the values of any pair of corresponding bits in the entry areas 1a and 1b in the storage unit 1.

However, in the case where the purpose of the diagnosis is only to detect the permanent fault, it is sufficient to perform only the operations of inputting the test pattern 8a in the first and second input cycles. During the first and second input cycles, the most significant bit (MSB) of the write-address counter 2 remains to be "0". That is, it is sufficient for the write-address counter 2 to have only a single (control) bit in addition to one or more bits needed for representing all the addresses of the entry areas in the storage unit 1 (which is the one bit for representing all the addresses of the entry areas 1a and 1b in the example of FIG. 1). Therefore, in the above case, the MSB of the write-address counter 2 is not needed, and the input-data selector 4 determines whether or not the data to be written in the entry areas 1a and 1b is to be inverted, on the basis of the single control bit of the write-address counter 2. Similar to the write-address counter 2, in the above case, the read-address counter 5 needs to have only a single (control) bit in addition to one or more bits needed for representing all the addresses of the entry areas in the storage unit 1 (which is the one bit for representing the addresses of the entry areas 1a and 1b in the example of FIG. 1). Further, in the above case, the output-data selector 7 determines whether the data to be outputted from the storage apparatus of FIG. 1 is the data outputted from the storage unit 1 or the data inverted by the output-data inverter 6, on the basis of the single control bit of the read-address counter 5.

In the case where only the permanent fault in the storage unit 1 is detected under the control using the single control bit, the operation of inputting the test pattern 8a is performed twice (in the first and second input cycles). Therefore, each of the value "0" and the value "1" is necessarily written in and read out from each bit in the storage unit 1 during the first and second input cycles. That is, when the value "0" is written in a bit in the first input cycle, the value "1" is written in the bit in the second input cycle. In addition, when the value "1" is written in a bit in the first input cycle, the value "0" is written in the bit in the second input cycle. Therefore, it is possible to detect both of the permanent stuck-at-zero fault (i.e., the permanent fault in which the value of a bit is stuck at the value "0") and the permanent stuck-at-one fault (i.e., the permanent fault in which the value of a bit is stuck at the value "1"). As long as the amount of the data of the test pattern 8a is equal to the storage capacity of the storage unit 1, the arrangement of the values of the bits constituting the test pattern 8a is arbitrary.

Further, the circuitry of the storage apparatus illustrated in FIG. 1 can be realized by a relatively simple logic circuits. Therefore, even in the case where the storage apparatus having the data input/output circuit having the construction of FIG. 1 is arranged in an LSI during mass production, it is not needed to increase the die size for the LSI. Therefore, in the following explanations on the embodiments, storage apparatuses substantially having the functions illustrated in FIG. 1 and being arranged in an LSI mounted in a server are taken as an example.

2. First Embodiment

In the first embodiment, the storage apparatus illustrated in FIG. 1 is used in a buffer for queue control. An example of the buffer for queue control is a FIFO which stores data protected by an ECC (Error Correction Code) and from which data stored earlier are read out earlier. In the case where data protected by an ECC are stored in the FIFO, existence or absence of a permanent fault or a delay fault can be determined by ECC checking which is performed when the data are read out. Therefore, in the first embodiment, a provision is made for fault diagnosis of a FIFO, where a diagnosis circuit performing ECC checking is assumed to be arranged in an LSI mounted in a server.

2.1 Construction of Server

Figure 2:
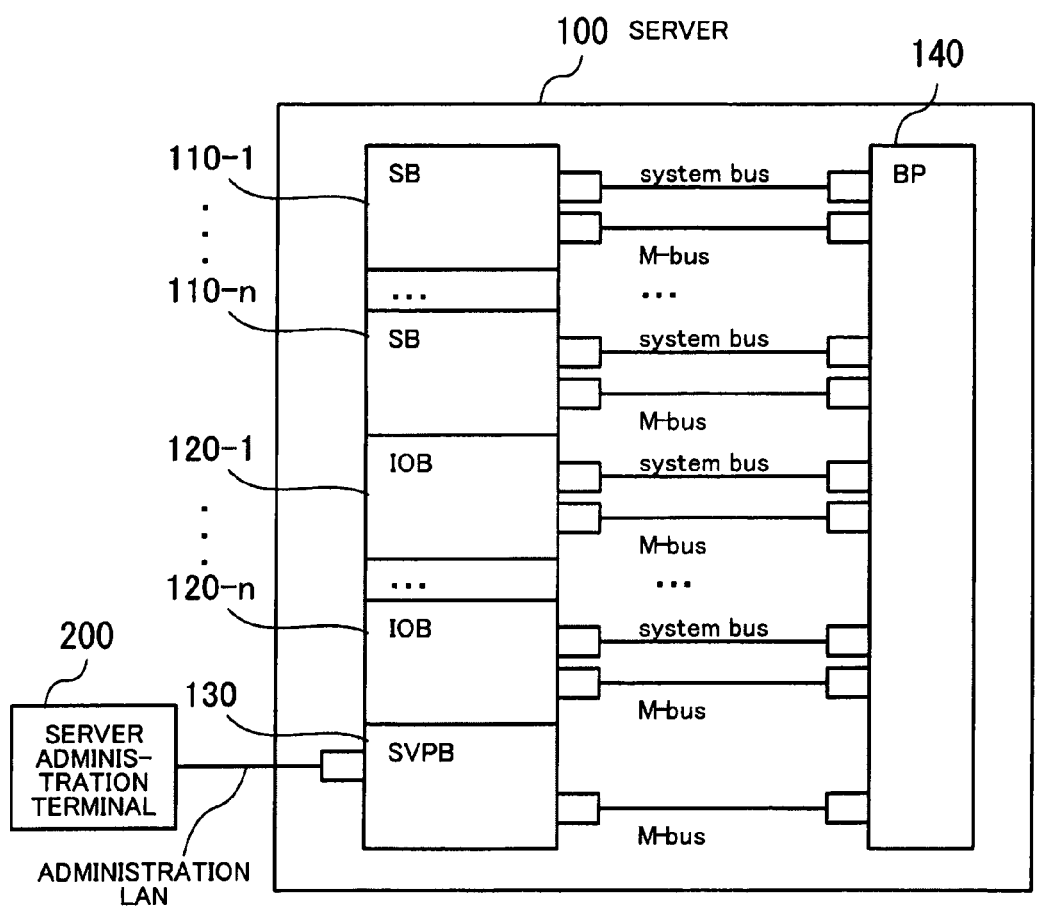
FIG. 2 illustrates a construction of a server according to a first embodiment.

FIG. 2 illustrates a construction of the server according to the first embodiment. The server 100 needs to have high reliability. In order to increase the reliability of the server 100, it is important to lower the possibility of occurrence of a system failure caused by a fault during system operation. Therefore, it is desirable to perform a diagnosis of the server 100 by the POST or the like and exclude a failed part with high reliability before start-up of the system.

The server 100 includes a plurality of system boards (SBs) 110-1, . . . , 110-n, a plurality of I/O boards (IOBs) 120-1, . . . , 120-n, a single service processor board (SVPB) 130, and a single backplane board (BP) 140. Each of the SBs 110-1, . . . , 110-n and the IOBs 120-1, . . . , 120-n is connected to the BP 140 through a system bus and a maintenance bus (M-bus). The SVPB 130 is connected to the BP 140 through the M-bus. The system buses are interconnected with each other in the BP 140, so that the SBs 110-1, . . . , 110-n are interconnected with each other through the system buses and the IOBs 120-1, . . . , 120-n are interconnected with each other through the system buses. In addition, the M-buses are also interconnected with each other in the BP 140, so that the SBs 110-1, . . . , 110-n and the IOBs 120-1, . . . , 120-n are connected to the SVPB 130 through the M-buses.

The SBs 110-1, . . . , 110-n perform operations for providing services through the server 100. When a CPU (Central Processing Unit) on an SB accesses a DRAM (Dynamic Random Access Memory) on another SB, a packet is transmitted from the SB on the accessing side through the system buses and the BP 140 to the SB on the accessed side.

The IOBs 120-1, . . . , 120-n performs high-speed communication with another server or the like. When a LAN controller on an IOB accesses a DRAM on one of the SBs, a packet is transmitted from the IOB on the accessing side through the system buses and the BP 140 to the SB on the accessed side.

A service processor on the SVPB 130 is connected to each of LSIs on the other boards through the M-buses. The service processor makes initial settings of the LSIs and monitors the condition of the LSIs through the M-buses. In addition, the service processor informs a server administration terminal 200 of the condition of the LSIs through an administration LAN (Local Area Network).

For example, a test program for diagnosis of a FIFO in a mass-production test is transmitted from the server administration terminal 200 to the server 100 through the administration LAN. After the service processor initializes the LSIs or the like, the test program is loaded on a DRAM on an SB, and is then executed by a CPU on the SB.

2.2 Internal Construction of System Board

Figure 3:
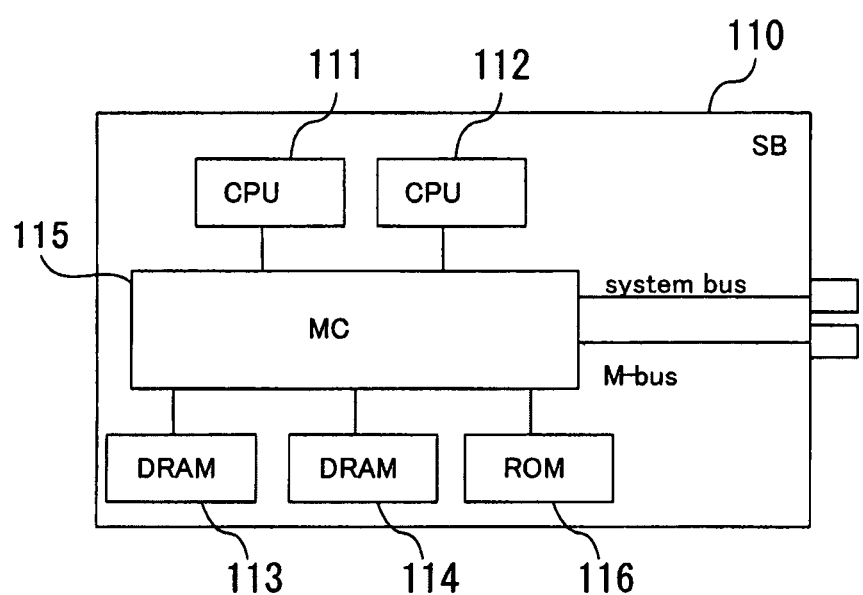
FIG. 3 illustrates an example of an internal construction of a system board in the first embodiment.

The internal construction of the system boards (SBs) 110-i ($1 \leq i \leq n$) is explained below with reference to FIG. 3, which illustrates an example of an internal construction of one of the system boards (SBs). (Hereinafter, each of the system boards (SBs) 110-i ($1 \leq i \leq n$) may be referred to as the system board 110 or the SB 110.) Each SB 110 includes CPUs 111 and 112, DRAMs 113 and 114, a memory controller (MC) 115, and a ROM (Read Only memory) 116. The CPUs 111 and 112, the DRAMs 113 and 114, and the ROM 116 are connected to the MC 115. The CPUs 111 and 112 perform data processing in accordance with instructions described in one or more programs. The DRAMs 113 and 114 temporarily store programs to be executed by the CPUs 111 and 112, data needed for the execution of the programs by the CPUs 111 and 112, the results of the execution, and the like. The MC 115 on the SB 110 is connected to the other SBs and the I/O boards (IOBs) through the system buses. The MC 115 performs access control on the basis of packets transmitted from the CPUs 111 and 112. For example, the MC 115 accesses one of the DRAMs 113 and 114 on the SB 110, DRAMs on the other SBs, LAN controllers and storage interfaces on the IOBs on the basis of packets transmitted from the CPUs 111 and 112. In addition, the MC 115 is connected to the service processor board (SVPB) 130 through the maintenance buses (M-buses). The ROM 116 stores programs including, for example, a test program needed for a POST (Power On Self Test) and a program needed for device initialization. The CPUs 111 and 112 read out the programs stored in the ROM 116, through the MC 115, and execute the programs.

2.3 Internal Construction of I/O Board

Figure 4:
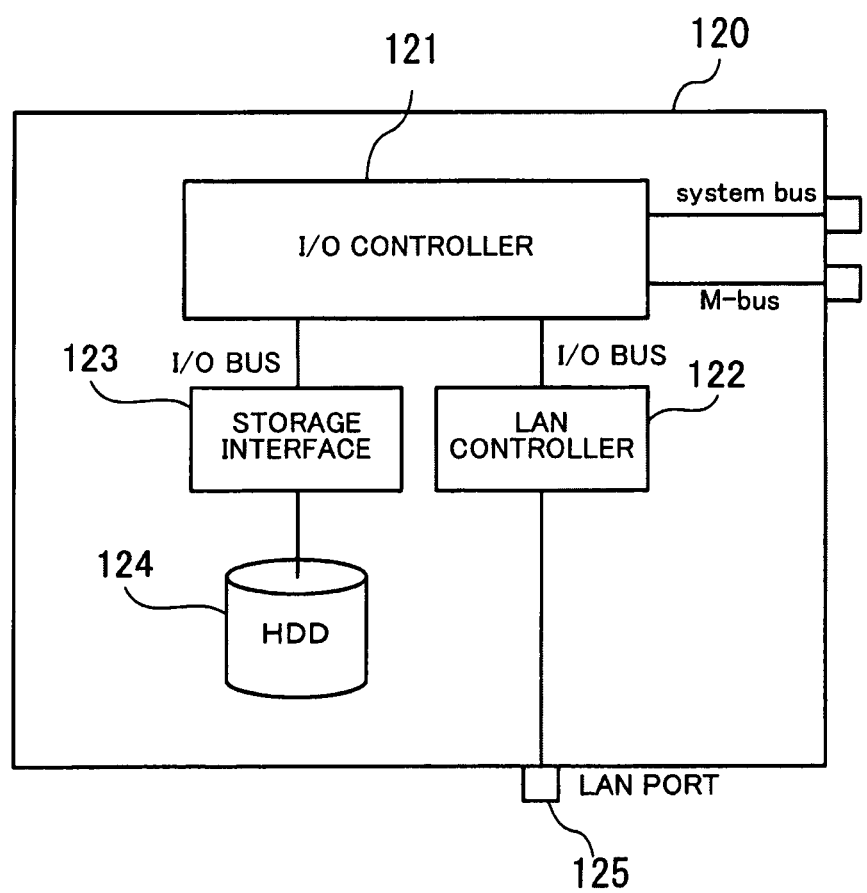
FIG. 4 illustrates an example of an internal construction of an I/O board in the first embodiment.

The internal construction of the I/O boards (IOBs) 120-j ($1 \leq j \leq n$) is explained below with reference to FIG. 4, which illustrates an example of an internal construction of one 120-j of the IOBs. (Hereinafter, each of the I/O boards (IOBs) 120-j ($1 \leq j \leq n$) may be referred to as the I/O board 120 or the IOB 120.) Each IOB 120 includes an I/O controller (IOC) 121, the LAN controller 122, a storage interface 123, and a hard disk drive (HDD) 124. The IOC 121 is connected to each of the LAN controller 122 and the storage interface 123 through an individually arranged I/O bus, In addition, the IOC 121 on the IOB 120 is also connected to the system boards (SBs) and the other IOBs through the system buses. Further, the IOC 121 is connected to the service processor board (SVPB) 130 through the maintenance buses (M-buses).

The LAN controller 122 is a controller for a computer network, and realizes a transfer rate on the order of gigabits per second. For example, the LAN controller 122 performs communication in accordance with the Gigabit Ethernet standard. (Ethernet is a registered trademark of Xerox Corporation.) The LAN controller 122 has a LAN port 125. When a LAN cable connected to another device is connected to the LAN port 125, the server 100 can perform communication with the other device.

The HDD 124 is connected to the storage interface 123, which is a communication interface between the IOC 121 and the HDD 124. For example, the storage interface 123 performs communication in accordance with the SAS (Serial Attached SCSI) standard. (SCSI stands for small computer system interface.)

2.4 Internal Construction of Service Processor Board

Figure 5:
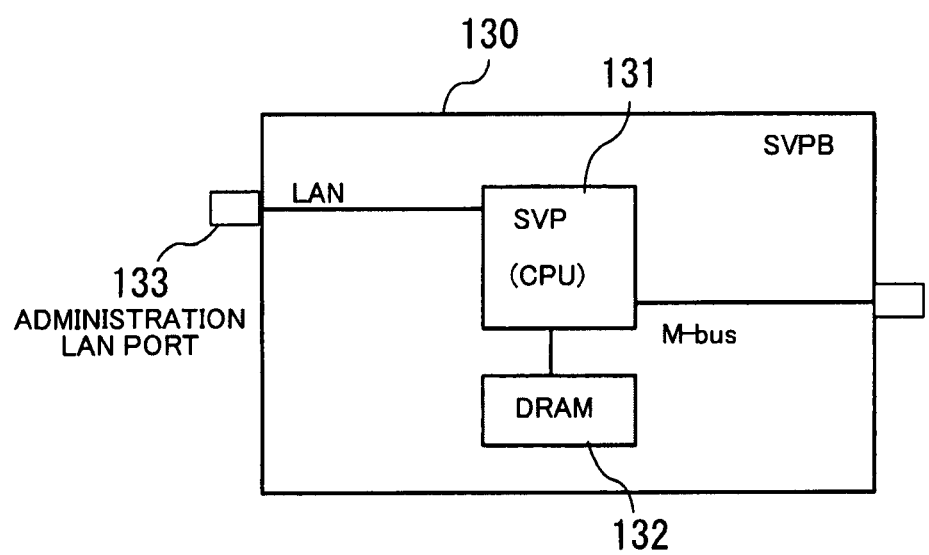
FIG. 5 illustrates an example of an internal construction of a service processor board in the first embodiment.

The internal construction of the service processor board (SVPB) 130 is explained below with reference to FIG. 5, which illustrates an example of an internal construction of the SVPB 130. The SVPB 130 includes the service processor (SVP) 131 and a DRAM 132. The SVP 131 is a CPU arranged for management of the server 100. The SVP 131 is connected to the memory controller (MC) 115 on each system board (SB) or the I/O controller (IOC) 121 on each I/O board (IOB) through the maintenance buses (M-buses). In addition, the SVPB 130 has an administration LAN port 133, to which the SVP 131 is connected. A LAN cable connected to the server administration terminal 200 is connected to the administration LAN port 133. When a packet is transmitted from the server administration terminal 200 through the LAN cable to the SVPB 130, the packet is inputted into the SVP 131 through the administration LAN port 133. Further, packets generated by the SVP 131 can be transmitted to the server administration terminal 200 through the administration LAN port 133.

2.5 Internal Construction of I/O Controller

The functions of the CPUs and the controllers on the system boards (SBs) and the I/O boards (IOBs) are realized in chips, and specifically FIFOs are formed in the chips. For example, FIFOs are arranged in locations in the I/O controller (IOC) 121 through which data or packets are outputted onto and inputted from the system buses or the I/O buses.

Figure 6:
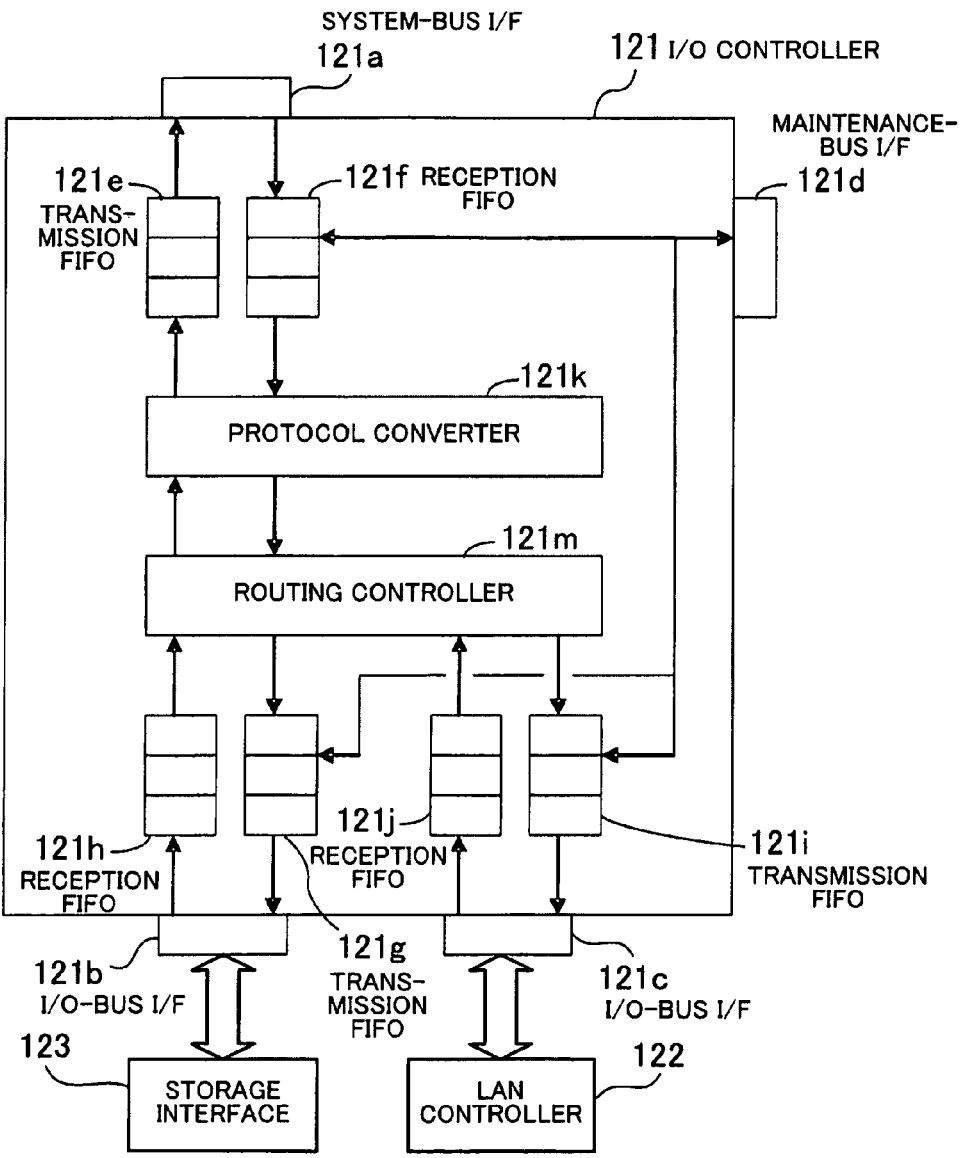
FIG. 6 illustrates an example of an internal structure of an I/O controller in the first embodiment.

FIG. 6 illustrates an example of an internal structure of the I/O controller 121. The IOC 121 is an LSI mounted on each of the I/O boards 120-1 to 120-n. The main function of the IOC 121 is protocol conversion. The IOC 121 has a system-bus interface (system-bus I/F) 121a, two I/O bus interfaces (I/O-bus I/Fs) 121b and 121c, a maintenance-bus interface (M-bus I/F) 121d. In addition, the IOC 121 includes a transmission FIFO 121e, a reception FIFO 121f, a transmission FIFO 121g, a reception FIFO 121h, a transmission FIFO 121i, a reception FIFO 121j, a protocol converter 121k, and a routing controller 121m.

The system-bus I/F 121a on each I/O board (IOB) 120 is connected through the BP 140 to the memory controller (MC) 115 on each system board (SB) and to the I/O controller on each of the other IOBs 120-1 to 120-n. The I/O-bus I/F 121b is connected to the storage interface 123, and the I/O-bus I/F 121c is connected to the LAN controller 122. The M-bus I/F 121d is connected to the service processor (SVP) 131 on the service processor board (SVPB) 130 through the BP 140. The transmission FIFO 121e is connected to the system-bus I/F 121a, and is used as a transmission buffer for data to be transmitted through the system-bus I/F 121a. In addition, the reception FIFO 121f is also connected to the system-bus I/F 121a, and is used as a reception buffer for data to be received through the system-bus I/F 121a. The transmission FIFO 121g is connected to the I/O-bus I/F 121b, and is used as a transmission buffer for data to be transmitted through the I/O-bus I/F 121b. In addition, the reception FIFO 121h is also connected to the I/O-bus I/F 121b, and is used as a reception buffer for data to be received through the I/O-bus I/F 121b. The transmission FIFO 121i is connected to the I/O-bus I/F 121c, and is used as a transmission buffer for data to be transmitted through the I/O-bus I/F 121c. In addition, the reception FIFO 121j is also connected to the I/O-bus I/F 121c, and is used as a reception buffer for data to be received through the I/O-bus I/F 121c.

The protocol converter 121k converts the format of a packet received through the system-bus I/F 121a into a packet format for the I/O buses, in accordance with the respective protocols for the system bus and the I/O buses. Similarly, the protocol converter 121k converts the format of a packet received through the I/O-bus I/F 121b or 121c into a packet format for the system bus, in accordance with the respective protocols for the system-bus and the I/O bus.

The routing controller 121m performs routing of packets transmitted from the system bus or the I/O buses.

The transmission FIFOs 121e, 121g, and 121i are connected to the M-bus I/F 121d. The SVP 131 mounted on the SVPB 130 accesses the transmission FIFOs 121e, 121g, and 121i through the maintenance buses (M-buses), and makes initial settings of inversion control flags and the like. In addition, the SVP 131 monitors the conditions of the transmission FIFOs 121e, 121g, and 121i through the M-buses on the basis of the ECCs in the transmission FIFOs 121e, 121g, and 121i, detection of signals instructing to increment an address counter, detection of uncorrectable errors (UE) or correctable errors (CE), and the like. When the IOC 121 detects an error, the IOC 121 informs the SVP 131 of the occurrence of the error through the M-buses. Then, the SVP 131 performs error processing according to details of the error, and informs the server administration terminal 200 of the occurrence of the error through the administration LAN.

2.6 Input/Output Circuit for FIFO

Figure 7:
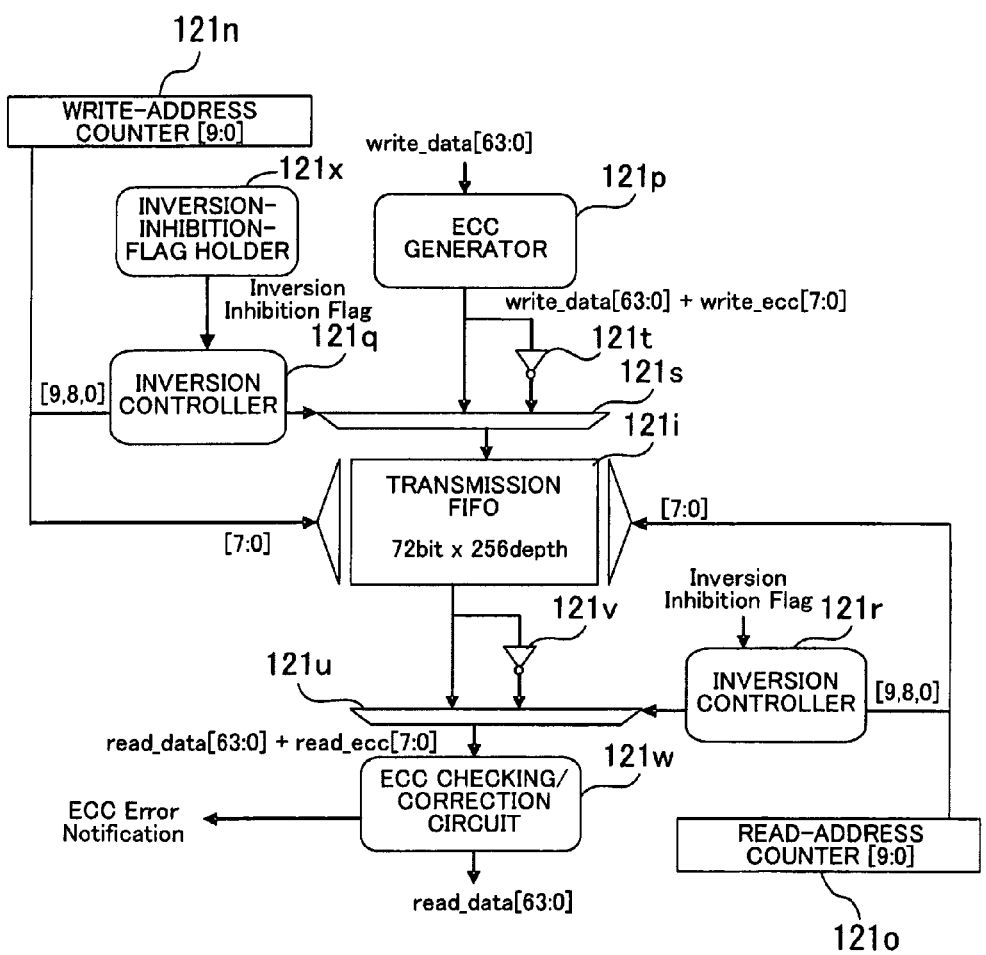
FIG. 7 illustrates an example of an input/output circuit for a FIFO in the first embodiment.

Inputs into and outputs from the FIFOs for diagnosis of the FIFOs are explained below. In the following explanations, diagnosis of the transmission FIFO 121i, among the FIFOs formed in an LSI realizing the functions of the I/O controller (IOC) 121, is taken as an example. FIG. 7 illustrates a data input/output circuit for inputting and outputting data into and from the transmission FIFO 121i for diagnosis of the transmission FIFO 121i. The transmission FIFO 121i is arranged in the stage preceding the I/O-bus I/F 121c, which is connected to the LAN controller 122. The data input/output circuit arranged for diagnosis of the transmission FIFO 121i and illustrated in FIG. 7 includes a write-address counter 121n, a read-address counter 121o, an ECC generator 121p, inversion controllers 121q and 121r, selectors 121s and 121u, inverters 121t and 121v, an inversion-inhibition-flag holder 121x, and an ECC checking/correction circuit 121w.

Each unit storage area constituting the transmission FIFO 121i has a bit width of 72 bits, and contains 64-bit data and an 8-bit ECC. The transmission FIFO 121i has a depth of 256. (The depth of the transmission FIFO 121i is the number of the entry areas (unit storage areas) which the transmission FIFO 121i has.) That is, the transmission FIFO 121i can store 256 pieces of data each accompanied by an ECC. The addresses of the 256 unit storage areas can be represented by eight bits.

Each of the write-address counter 121n and the read-address counter 121o has ten bits. That is, the number of bits constituting each of the write-address counter 121n and the read-address counter 121o is two bits greater than the number of bits needed for representing all the addresses of the transmission FIFO 121i. The number of the conventional address counter is one bit greater than the address size of the FIFO, and the most significant bit (MSB) of the conventional address counter is used for detection of an overflow or an underflow. On the other hand, in each address counter according to the present embodiment (i.e., each of the write-address counter 121n and the read-address counter 121o), the zeroth bit corresponds to the least significant bit (LSB) of the conventional address counter, and the eighth bit corresponds to the MSB of the conventional address counter used for detection of an overflow or an underflow. The ninth bit in each of the write-address counter 121n and the read-address counter 121o is specifically provided according to the present embodiment as the inversion control flag. The inversion control flag is a one-bit flag having an initial value of "0". The value of the inversion control flag is inverted when the count of the address counter (the write-address counter 121n or the read-address counter 121o) is incremented after the values of the zeroth to eighth bits of the address counter become all "1". The eight bits from the zeroth bit to the seventh bit constituting each of the write-address counter 121n and the read-address counter 121o indicate the address in the transmission FIFO 121i. That is, each of the write-address counter 121n and the read-address counter 121o according to the present embodiment is different from the conventional address counter only in the addition of the one-bit inversion control flag.

The value (count) of the write-address counter 121n is outputted when a piece of data is newly stored in the transmission FIFO 121i. At this time, the values of the eight bits from the zeroth bit to the seventh bit constituting the write-address counter 121n are supplied to the transmission FIFO 121i as the write address. In addition, the values of the zeroth, eighth, and ninth bits constituting the write-address counter 121n are inputted into the inversion controller 121q. When a piece of data is newly stored in the transmission FIFO 121i, the write-address counter 121n increments by one the count represented by the ten bits, so that the address designating the entry area in which the next piece of data is to be stored in the transmission FIFO 121i is set in the write-address counter 121n. The inversion controller 121q outputs to the selector 121s an inversion control signal which indicates whether or not each piece of data accompanied by an ECC is to be inverted, according to the values of the three bits inputted from the write-address counter 121n. In addition, an inversion inhibition flag is outputted from the inversion-inhibition-flag holder 121x to the inversion controller 121q. The service processor (SVP) 131 sets the inversion inhibition flag in the inversion-inhibition-flag holder 121x. The inversion inhibition flag is information indicating forced inhibition of the inversion of the data accompanied by an ECC. When an active value (e.g., "1") is set in the inversion inhibition flag, the inversion controller 121q outputs to the selector 121s an inversion control signal indicating unnecessity of inversion, regardless of the values of the bits outputted from the write-address counter 121n. The relationship between the input and the output of the inversion controller 121q will be explained later with reference to FIG. 8.

The value (count) of the read-address counter 121o is outputted when a piece of data is read out from the transmission FIFO 121i. At this time, the values of the eight bits from the zeroth bit to the seventh bit constituting the read-address counter 121o are supplied to the transmission FIFO 121i as the read address. In addition, the values of the zeroth, eighth, and ninth bits constituting the read-address counter 121o are inputted into the inversion controller 121r. When a piece of data is read out from the transmission FIFO 121i, the read-address counter 121o increments by one the count represented by the ten bits, so that the address designating the entry area in the transmission FIFO 121i from which the next piece of data is to be read out is set in the read-address counter 121o. The inversion controller 121r outputs to the selector 121u an inversion control signal which indicates whether or not each piece of data accompanied by an ECC is to be inverted, according to the values of the three bits inputted from the read-address counter 121o. In addition, the inversion inhibition flag is outputted from the inversion-inhibition-flag holder 121x to the inversion controller 121r (although the connection between the inversion-inhibition-flag holder 121x and the inversion controller 121r is not illustrated in FIG. 7). As mentioned before, the inversion inhibition flag is information indicating forced inhibition of the inversion of the data accompanied by an ECC. When an active value (e.g., "1") is set in the inversion inhibition flag, the inversion controller 121r outputs to the selector 121u an inversion control signal indicating unnecessity of inversion, regardless of the values of the bits outputted from the read-address counter 121o. The relationship between the input data and the output of the inversion controller 121r will be explained later with reference to FIG. 8.

The 64-bit write data to be written in the transmission FIFO 121i (write_data[63:0]) is inputted into the ECC generator 121p. The ECC generator 121p generates an ECC for the inputted write data. In this example, the 64-bit write data is inputted into the ECC generator 121p, and an 8-bit ECC is generated. Then, the write data accompanied by the ECC (write_data[63:0]+write_ecc[7:0]) is outputted from the ECC generator 121p.

When a piece of data accompanied by an ECC is outputted from the ECC generator 121p, the data accompanied by the ECC is inputted into the selector 121s and the inverter 121t. The inverter 121t inverts the values of all the bits constituting the inputted data accompanied by the ECC. (That is, the inverter 121t changes the value "0" to "1" and the value "1" to "0".) Then, the inverted data accompanied by the inverted ECC is inputted into the selector 121s. The selector 121s selects one of the noninverted data accompanied by the noninverted ECC and the inverted data accompanied by the inverted ECC according to the inversion control signal received from the inversion controller 121q, and outputs the selected one to the transmission FIFO 121i. Specifically, when the inversion control signal indicates unnecessity of inversion, the selector 121s outputs to the transmission FIFO 121i the noninverted data accompanied by the noninverted ECC. When the inversion control signal indicates necessity of inversion, the selector 121s outputs to the transmission FIFO 121i the inverted data accompanied by the inverted ECC. The transmission FIFO 121i stores the data accompanied by the ECC and outputted from the selector 121s in the entry area indicated by the 8-bit address value received from the write-address counter 121n. In addition, the transmission FIFO 121i outputs data accompanied by an ECC and stored in the entry area indicated by the 8-bit address value received from the read-address counter 121o. The output data (i.e., the data accompanied by the ECC outputted from the transmission FIFO 121i) is inputted into the selector 121u and the inverter 121v. The inverter 121v inverts the values of all the bits constituting the output data containing the ECC and being inputted into the inverter 121v. (That is, the inverter 121v changes the value "0" to "1" and the value "1" to "0".) Therefore, in the case where the output data containing the ECC and being outputted from the transmission FIFO 121i is inverted data accompanied by an inverted ECC (i.e., data accompanied by an ECC and inverted by the inverter 121t), the inverter 121v is considered to restore the noninverted data accompanied by the noninverted ECC. The inverted output data containing the ECC and being inverted by the inverter 121v is inputted into the selector 121u. The selector 121u selects one of the output data containing the ECC and being outputted from the transmission FIFO 121i and the inverted output data containing the inverted ECC and being outputted from the inverter 121v, according to the inversion control signal received from the inversion controller 121r, and outputs to the ECC checking/correction circuit 121w the selected output data containing the ECC. Specifically, when the inversion control signal indicates unnecessity of inversion, the selector 121u outputs to the ECC checking/correction circuit 121w the output data containing the ECC and outputted from the transmission FIFO 121i. When the inversion control signal indicates necessity of inversion, the selector 121u outputs to the ECC checking/correction circuit 121w the inverted output data containing the inverted ECC and outputted from the inverter 121v. The noninverted output data or the inverted output data outputted from the selector 121u is 72-bit data containing the ECC (read_data[63:0]+read ecc[7:0]), where the leading 64 bits constitute the read data, and the following 8 bits constitute the ECC.

The ECC checking/correction circuit 121w checks the ECC accompanying the read data received from the selector 121u. When an error is detected by the ECC checking, the ECC checking/correction circuit 121w makes a notification or a correction of the error. Specifically, the ECC checking/correction circuit 121w generates an ECC of the read data, and compares the generated ECC with the ECC received from the selector 121u. When the ECC generated by the ECC checking/correction circuit 121w coincides with the ECC received from the selector 121u, the ECC checking/correction circuit 121w determines absence of an error, and outputs the read data (read data[63:0]) received from the selector 121u. When the ECC generated by the ECC checking/correction circuit 121w does not coincide with the ECC received from the selector 121u, the ECC checking/correction circuit 121w detects an error. When the detected error is a correctable error (CE), the ECC checking/correction circuit 121w corrects the read data and outputs the corrected read data. When the detected error is an uncorrectable error (UE), the ECC checking/correction circuit 121w outputs a notification of an ECC error. The notification is transmitted to the SVP 131 in the service processor board (SVPB) 130 through the maintenance bus (M-bus).

Next, the relationship between the input and the output in each of the inversion controllers 121q and 121r is explained below. FIG. 8 indicates examples of the inputs into and the outputs from each of the inversion controllers 121q and 121r. The following explanations with reference to FIG. 8 are common to the inversion controllers 121q and 121r. Therefore, in the following explanations with reference to FIG. 8, each of the inversion controllers 121q and 121r is referred to as the inversion controller, and each of the write address which is partially inputted into the inversion controller 121q and the read address which is partially inputted into the inversion controller 121r is simply referred to as the address.

As indicated in FIG. 8, the values of the ninth, eighth, and zeroth bits of the address are inputted into the inversion controller. Then, the inversion controller outputs an inversion control signal indicating whether or not data inversion is needed, according to the values inputted as above. When the value of the inversion inhibition flag is "1", the inversion controller outputs, on all occasions, an inversion control signal indicating no inversion. When the value of the inversion inhibition flag is "0", inversion or noninversion is determined according to the values of the ninth, eighth, and zeroth bits of the address as follows.

When both of the values of the ninth bit and the eighth bit of the address are "0", the inversion controller outputs an inversion control signal indicating no inversion regardless of the value of the zeroth bit of the address. When the values of the ninth and eighth bits of the address are respectively "0" and "1", the inversion controller outputs an inversion control signal indicating inversion regardless of the value of the zeroth bit of the address. When the values of the ninth, eighth, and zeroth bits of the address are respectively "1", "0", and "0", the inversion controller outputs an inversion control signal indicating no inversion. When the values of the ninth, eighth, and zeroth bits of the address are respectively "1", "0", and "1", the inversion controller outputs an inversion control signal indicating inversion. When the values of the ninth, eighth, and zeroth bits of the address are respectively "1", "1", and "0", the inversion controller outputs an inversion control signal indicating inversion. When the values of the ninth, eighth, and zeroth bits of the address are respectively "1", "1", and "1", the inversion controller outputs an inversion control signal indicating no inversion.

The FIFO and the data input/output circuit having the constructions explained above enable detection of the permanent fault and the delay fault. In this case, although the data pattern to be written in the FIFO is generated in accordance with the test program, the data pattern may have random values. However, the size of the data pattern corresponds to the capacity of the FIFO, and the data pattern is to be inputted into the ECC generator 121p four times without changing the arrangement of the values in the test pattern.

2.7 Test Pattern and Fault Detection

When the test program is executed in the server 100, the CPUs in the system boards (SBs) 110-1, . . . , 110-n perform processing in accordance with the test program. During the processing, packets containing predetermined information are outputted from the SBs 110-1, . . . , 110-n to the IOBs 120-1, . . . , 120-n.

Figure 9:
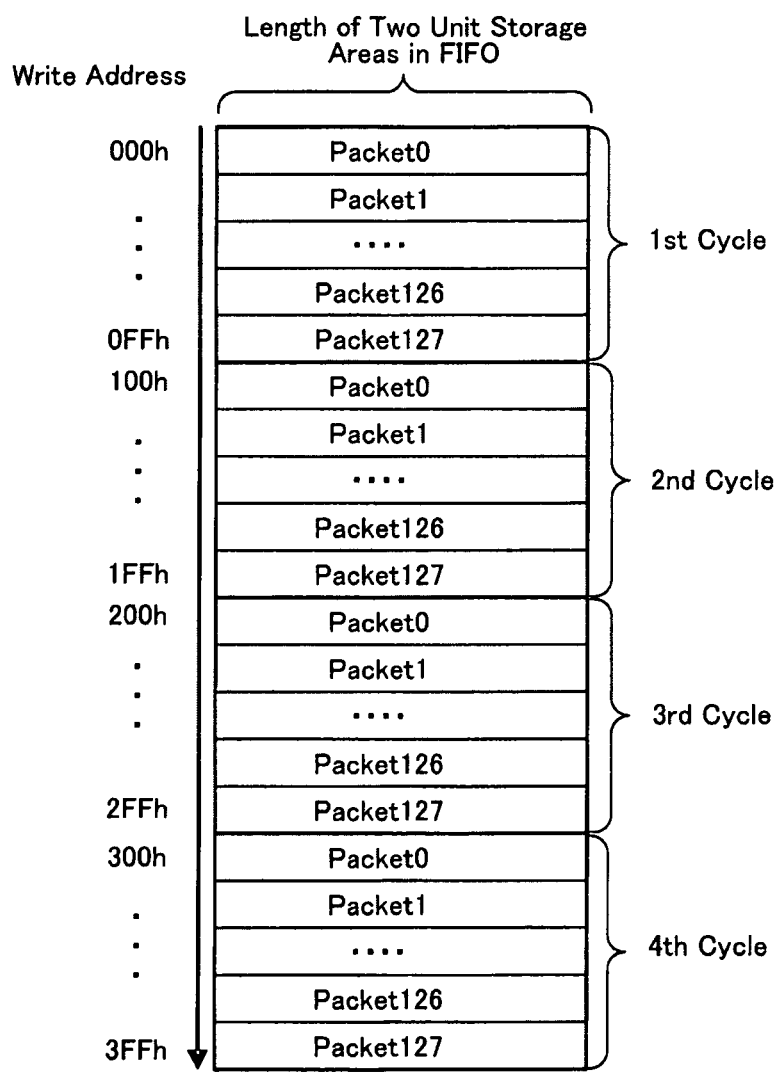
FIG. 9 illustrates an example of a test pattern for diagnosis of a FIFO in the first embodiment.

FIG. 9 illustrates an example of a test pattern for diagnosis of the FIFO. The example of the test pattern illustrated in FIG. 9 is provided for fault detection in the transmission FIFO 121i illustrated in FIG. 7. In the example of FIG. 9, the pieces of test data "Packet0" to "Packet127" constitute the test pattern, and each of the pieces of test data "Packet0" to "Packet127" corresponds to a packet transmission instruction to transmit a packet through the transmission FIFO 121i, where the packet transmission instruction is described in the test program.

When transmission packets for transmission of the pieces of test data are transmitted from one of the system boards (SBs) 110-1, . . . , 110-n to the one of the I/O boards (IOBs) 120-1, . . . , 120-n which contains the IOC 121, the test pattern of FIG. 9 is transmitted through the transmission FIFO 121i.

The test program is executed by the CPU 111 on each system board (SB) 110, and the object of the test program is to diagnose the transmission FIFO 121i which is formed in the LSI being mounted on the IOC 120 and realizing the functions of the IOC 121. Therefore, the packet transmission instructions described in the test program are a type of access instruction from the CPU 111 to the LAN controller 122.

In the transmission FIFO 121i, the 8-byte write data (write_data[63:0]) which depends on the test program is written. Unless the transmission FIFO 121i is failed, the values written in the transmission FIFO 121i are read out as the read data (read_data[63:0]).

The inversion in writing and reading data in and from the transmission FIFO 121i is controlled according to the values of the ninth, eighth, and zeroth bits of the address (address[9], address[8], and address[0]) in the manner explained before with reference to FIG. 8. That is, the data inversion is controlled in identical manner in writing and reading.

The test program is described so that the operation of writing and reading of the test pattern in and from the transmission FIFO 121i is performed four times (in four cycles). In order to achieve a high fault detection rate, the identical test pattern is used in the four times repetition of writing and reading of the test pattern. The data amount of the test pattern corresponds to the depth of the transmission FIFO 121i, where the depth of (i.e., the number of entries in) the transmission FIFO 121i corresponds to the capacity of the transmission FIFO 121i. As mentioned before, the depth of the transmission FIFO 121i is 256. In addition, in the example of FIG. 9, both of a header and data of a packet generated according to each packet transmission instruction are stored in the transmission FIFO 121i, and the total length of the header and the data of each packet is assumed to be 16 bytes. In this case, two entries (corresponding to the depth of two) in the transmission FIFO 121i are used when each packet is written in the transmission FIFO 121i. Therefore, when the 128 packets constituting the test pattern are transmitted, the data can be written in all entries in the transmission FIFO 121i.

The test program contains transmission instructions for transmitting the 128 packets four times from the IOC 121 to the LAN controller 122. That is, when the CPU on the system board executes the test program, the IOC 121 transmits 128×4 packets in total.

In the first cycle of the transmission of the test pattern constituted by the 128 packets, the write address for writing in the transmission FIFO 121i the first half of the packet generated in accordance with the first packet transmission instruction is "000h", where "h" indicates that the number preceding "h" is in hexadecimal notation. The count of the write-address counter 121n is incremented when each of the first and second halves of the packets generated in accordance with the successive packet transmission instructions is written in the transmission FIFO 121i. Finally, the write address becomes "0FFh" when the second half of the 128th packet is written in the transmission FIFO 121i in the first cycle. Thus, the processing for writing the test pattern in the first cycle is realized by the above transmission of the 128 packets.

As explained above, the write address varies from "000h" to "0FFh" during the first cycle of writing the test pattern. That is, the ninth and eighth bits of the write address are always "0" during the first cycle, so that all the bits of the write data are written in the transmission FIFO 121i without inversion in the first cycle. In addition, the data written in the transmission FIFO 121i in the first cycle are read out and outputted as the read data without inversion. Therefore, some types of permanent faults and delay faults depending on the test pattern can be detected during the first cycle. For example, when the value "0" is written in a bit having a permanent stuck-at-one fault, the permanent fault can be detected. However, when the value "1" is written in a bit having a permanent stuck-at-one fault, the permanent fault may not be detected. In addition, for example, in the case where the value of the leading bit of the first half of the leading packet in the test pattern is "0" and the value of the leading bit of the second half of the leading packet is "1", it is possible to determine that a delay fault occurs in the leading bit of the second half of the leading packet, when the value of the leading bit of the second half of the leading packet is read as "0". However, in the case where both of the values of the leading bits of the first and second halves of the leading packet in the test pattern are "0", it is impossible to detect the delay fault.

In the second cycle of writing the test pattern, the write address for writing in the transmission FIFO 121i the first half of the packet generated in accordance with the first packet transmission instruction is "100h". The count of the write-address counter 121n is incremented when each of the first and second halves of the packets generated in accordance with the successive packet transmission instructions is written in the transmission FIFO 121i. Finally, the write address becomes "1FFh" when the second half of the 128th packet is written in the transmission FIFO 121i in the second cycle. Thus, the processing for writing the test pattern in the second cycle is realized by the above transmission of the 128 packets.

As explained above, the write address varies from "100h" to "1FFh" during the second cycle of writing the test pattern. That is, the ninth bit of the write address is always "0" and the eighth bit of the write address is always "1" during the second cycle, so that all the bits of the write data are inverted before being written in the transmission FIFO 121i in the second cycle. In addition, the data written in the transmission FIFO 121i in the second cycle are read out and inverted before being outputted as the read data. Therefore, in the second cycle, it is possible to detect the permanent faults in which the value of a bit is stuck at the value different from the value at which the sticking occurs in the permanent faults detectable in the first cycle. For example, when the value "1" is written in a bit having a permanent stuck-at-one fault in the first cycle, the permanent stuck-at-one fault may not be detected in the first cycle. However, since the inverted value "0" is written in the above bit having the permanent stuck-at-one fault in the second cycle, the permanent stuck-at-one fault can be detected in the second cycle. Therefore, the operations of writing and reading the noninverted and inverted test pattern in the first and second cycles enable permanent-fault diagnosis of all the bits in the transmission FIFO 121i.

In addition, the operation of writing and reading the inverted test pattern in the second cycle enables delay-fault diagnosis of successive bits (the values of which are to be read out in succession) in the transmission FIFO 121i with a sequence of values different from the sequence of values with which the delay-fault diagnosis can be performed in the first cycle. For example, in the case where the value of the leading bit of the first half of the leading packet in the test pattern is "0" and the value of the leading bit of the second half of the leading packet is "1", the values "0" and "1" of the leading bits of the first and second halves of the leading packet are written in the transmission FIFO 121i as they are in the first cycle. However, in the second cycle, the inverted values of the leading bits of the first and second halves of the leading packet are written in the same successive bits in the transmission FIFO 121i. That is, in the second cycle, the inverted value "1" of the leading bit of the first half of the leading packet in the test pattern is written in the position in the transmission FIFO 121i for the leading bit of the first half of the leading packet, and the inverted value "0" of the leading bit of the second half of the leading packet in the test pattern is written in the position in the transmission FIFO 121i for the leading bit of the second half of the leading packet. Therefore, when the inverted value of the leading bit of the second half of the leading packet is read as "1", it is possible to determine that a delay fault occurs in the leading bit of the second half of the leading packet.

In the third cycle of writing the test pattern, the write address for writing in the transmission FIFO 121i the first half of the packet generated in accordance with the first packet transmission instruction is "200h". The count of the write-address counter 121*n* is incremented when each of the first and second halves of the packets generated in accordance with the successive packet transmission instructions is written in the transmission FIFO 121*i*. Finally, the write address becomes "2FFh" when the second half of the 128th packet is written in the transmission FIFO 121*i* in the third cycle. Thus, the processing for writing the test pattern in the third cycle is realized by the above transmission of the 128 packets.

As explained above, the write address varies from "200h" to "2FFh" during the third cycle of writing the test pattern. That is, the ninth bit of the write address is always "1" and the eighth bit of the write address is always "0" during the third cycle. Therefore, when the zeroth bit (LSB) of the write address is "0", the corresponding portion of the test pattern is written in the transmission FIFO 121*i* without inversion. When the zeroth bit (LSB) of the write address is "1", the corresponding portion of the test pattern is inverted before being written in the transmission FIFO 121*i*. In addition, when the zeroth bit (LSB) of the read address is "0", the corresponding data written in the transmission FIFO 121*i* is read out as the read data without inversion. When the zeroth bit (LSB) of the read address is "1", the corresponding data written in the transmission FIFO 121*i* is read out and inverted before being outputted as the read data.

Further, the operation of writing and reading the test pattern in the third cycle enables delay-fault diagnosis of successive bits (the values of which are to be read out in succession) with a sequence of values different from the sequences of values with which the delay-fault diagnosis can be performed in the first and second cycles. For example, in the case where both of the values of the leading bits of the first and second halves of the leading packet in the test pattern are "0", the values "0" of the leading bits of the first and second halves of the leading packet are respectively written in the bits designated by the addresses "000h" and "001h" in the transmission FIFO 121*i* as they are in the first cycle. In the second cycle, the inverted values "1" of the leading bits of the first and second halves of the leading packet are respectively written in the bits designated by the addresses "100h" and "101h" in the transmission FIFO 121*i* (which are the same bits in the transmission FIFO 121*i* as the bits designated by the addresses "000h" and "001h"). That is, in the case where the values in the test pattern written in successive bits subject to delay-fault diagnosis in the transmission FIFO 121*i* are identical, it is impossible to detect the delay fault in the first and second cycles. On the other hand, even in the case where the values in the test pattern written in successive bits subject to delay-fault diagnosis in the transmission FIFO 121*i* are identical, in the third cycle, the second half of each of the pieces of test data is inverted before being written in the transmission FIFO 121*i* in accordance with the relationships indicated in FIG. 8 since both of the values of the ninth and zeroth bits of the read address are "1" and the value of the eighth bit of the read address is "0". Therefore, in the third cycle, it is possible to detect the delay fault can be detected in the third cycle even in the case where the values in the test pattern written in successive bits subject to delay-fault diagnosis in the transmission FIFO 121*i* are identical. For example, in the case where both of the values of the leading bits of the first and second halves of the leading packet in the test pattern are "0", in the third cycle, the value "0" of the leading bit of the second half of the leading packet is inverted before being written in the transmission FIFO 121*i* although the value "0" of the leading bit of the first half of the leading packet is written as it is in the transmission FIFO 121*i*. Therefore, it is possible to determine that a delay fault occurs in the leading bit of the second half of the leading packet, when the value of the leading bit of the second half of the leading packet is read as "0".

In the fourth cycle of writing the test pattern, the write address for writing in the transmission FIFO 121*i* the first half of the packet generated in accordance with the first packet transmission instruction is "300h". The count of the write-address counter 121*n* is incremented when each of the first and second halves of the packets generated in accordance with the successive packet transmission instructions is written in the transmission FIFO 121*i*. Finally, the write address becomes "3FFh" when the second half of the 128th packet is written in the transmission FIFO 121*i* in the fourth cycle. Thus, the processing for writing the test pattern in the fourth cycle is realized by the above transmission of the 128 packets.

As explained above, the write address varies from "300h" to "3FFh" during the fourth cycle of writing the test pattern. That is, the ninth and eighth bits of the write address are always "1" during the fourth cycle. Therefore, when the zeroth bit (LSB) of the write address is "0", the corresponding portion of the test pattern is inverted before being written in the transmission FIFO 121*i*. When the zeroth bit (LSB) of the write address is "1", the corresponding portion of the test pattern is written in the transmission FIFO 121*i* without inversion. In addition, when the zeroth bit (LSB) of the read address is "0", the corresponding data written in the transmission FIFO 121*i* is read out and inverted before being outputted as the read data. When the zeroth bit (LSB) of the read address is "1", the corresponding data written in the transmission FIFO 121*i* is read out as the read data without inversion.

In addition, the operation of writing and reading the test pattern in the fourth cycle enables delay-fault diagnosis of successive bits (the values of which are to be read out in succession) with a sequence of values different from the sequences of values with which the delay-fault diagnosis can be performed in the first, second, and third cycles. For example, in the case where both of the values of the leading bits of the first and second halves of the leading packet in the test pattern are "0", in the third cycle, the value "0" of the leading bit of the first half of the leading packet is written as it is in the transmission FIFO 121*i*, and the value "0" of the leading bit of the second half of the leading packet is inverted before being written in the transmission FIFO 121*i*. On the other hand, in the fourth cycle, the value "0" of the leading bit of the first half of the leading packet is inverted before being written in the transmission FIFO 121*i*, and the value "0" of the leading bit of the second half of the leading packet is written as it is in the transmission FIFO 121*i*. Therefore, it is possible to determine that a delay fault occurs in the leading bit of the second half of the leading packet, when the value of the leading bit of the second half of the leading packet is read as "1".

As explained above, it is possible to perform a diagnosis for determining the existence or absence of the permanent fault and the delay fault in the transmission FIFO 121*i* by transmitting the test pattern corresponding to the depth of the transmission FIFO 121*i* four times. At this time, the fault detection rate does not depend the contents (data pattern) of the 128 packet transmission instructions constituting the test pattern. When a permanent fault or delay fault is detected in the transmission FIFO 121*i*, the ECC checking/correction circuit 121*w* makes a notification of an ECC error.

2.8 Processing According to Test Program

Figure 10:
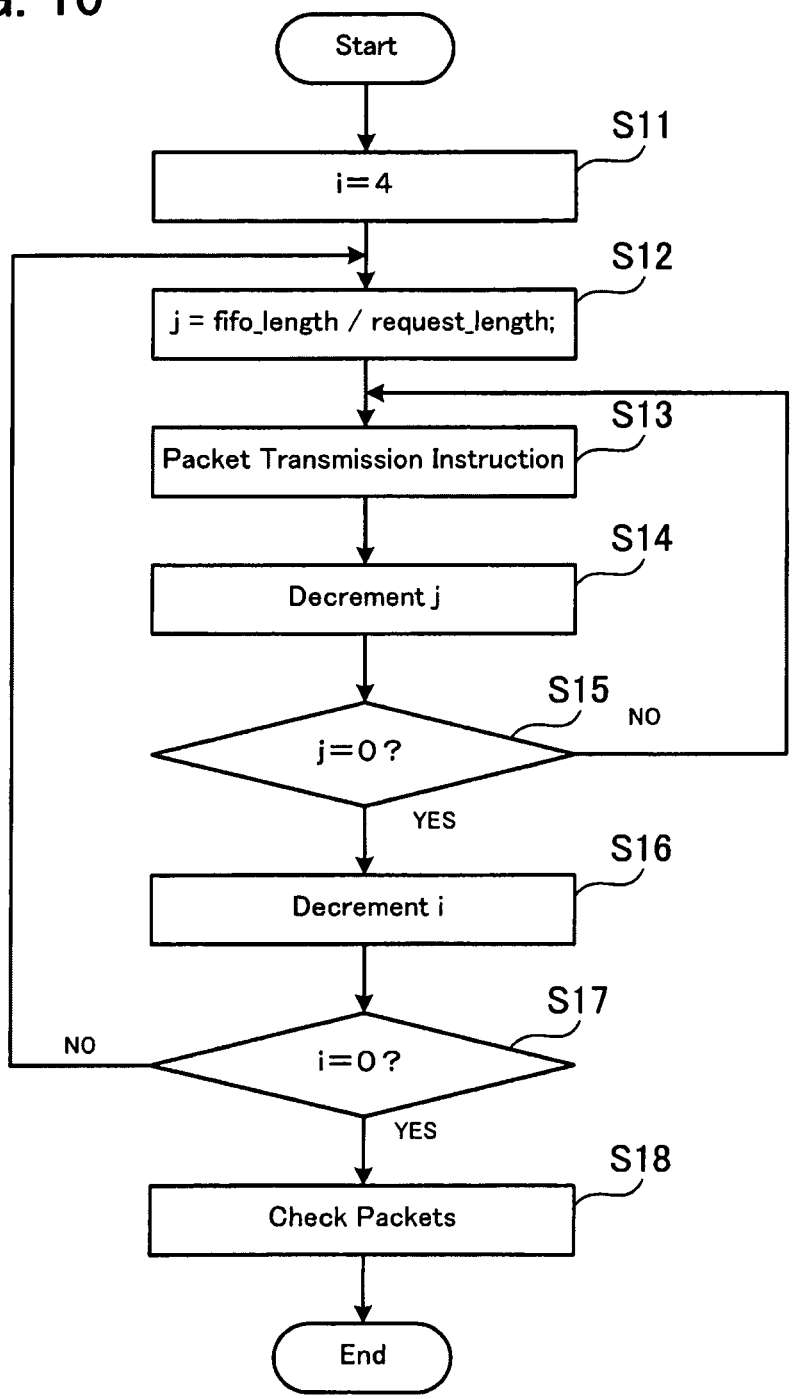
FIG. 10 is a flow diagram indicating a sequence of packet transmission processing according to a test program.

A sequence of operations performed in accordance with a test program for transmitting packets constituting a test pattern as illustrated in FIG. 9 are explained below with reference to FIG. 10, which is a flow diagram indicating the sequence of packet transmission processing according to the test program. The processing of FIG. 10 is explained step by step. In the following explanations, the test program is assumed to be described for testing the transmission FIFO 121i by the CPU 111 in the system board (SB) 110.

<Step S11> The CPU 111 sets the initial value "4" to a variable i. The variable i indicates the remaining number of times the test pattern is to be transmitted. The test pattern is prepared in advance so that the data amount of the test pattern corresponds to the depth of the FIFO.

<Step S12> The CPU 111 sets to a variable j the number of packets to be transmitted in correspondence with the depth of the transmission FIFO 121i. Specifically, the depth (fifo_length) of the transmission FIFO 121i and the number (request_length) of entry areas in the transmission FIFO 121i which are to be used for each packet are given in advance as constants in the test program. The CPU 111 divides the depth (fifo_length) of the transmission FIFO 121i by the number (request_length), and sets the quotient as the initial value of the variable (j=fifo_length/request_length). In the present embodiment, the depth of the transmission FIFO 121i is 256 (i.e., the transmission FIFO 121i contains 256 entry areas.) In addition, two entry areas are used for storing each packet. Therefore, the initial value "128 (=256/2)" is set to the variable j.

<Step S13> The CPU 111 executes an instruction for transmission of a packet. Specifically, the CPU 111 generates a packet addressed to a network device on a network to which the LAN port 125 on the I/O board (IOB) 120 is connected, and the CPU 111 executes the instruction for transmission of the packet, so that the packet is transferred from the SB 110 to the IOB 120 (one of the IOBs 120-1, . . . , 120-n) through the system buses.

The I/O controller (IOC) 121 on the IOB 120 receives the transferred packet, and stores the packet in the reception FIFO 121f. Then, the protocol converter 121k transforms the data format of the packet so that the packet is adapted to the communication protocol of the I/O bus. The transformed packet is routed by the routing controller 121m, and is then stored in the transmission FIFO 121i as a packet to be transmitted. Thereafter, the packet to be transmitted is outputted from the transmission FIFO 121i to the LAN controller 122 through the I/O-bus I/F 121c.

When a packet is transferred from the IOC 121 to the LAN controller 122 as above, data in the length of the packet is written in and read out from the transmission FIFO 121i.

<Step S14> The CPU 111 decrements the variable j by one.

<Step S15> The CPU 111 determines whether or not the variable j is zero. When the variable j is equal to or greater than one, the operation goes to step S13, and packet transmission for the test pattern in the current cycle is continued. When the variable j is equal to zero, the operation of transmitting the entire test pattern in the current cycle is completed, so that the operation goes to step S16.

<Step S16> The CPU 111 decrements the variable i by one.

<Step S17> The CPU 111 determines whether or not the variable i is zero. When the variable i is equal to or greater than one, the operation goes to step S12, and packet transmission in the next cycle is started. When the variable i is equal to zero, the operation of transmitting the entire test pattern four times is completed, so that the operation goes to step S18.

<Step S18> The CPU 111 checks whether or not all the packets have been normally transmitted. Specifically, when no notification of an ECC error is outputted from the ECC checking/correction circuit 121w during the execution of steps S12 to S17, the CPU 111 can determine that all the packets have been normally transmitted. When a notification of an ECC error is outputted from the ECC checking/correction circuit 121w, the CPU 111 can recognize the possibility that a permanent fault or a delay fault may exist in the transmission FIFO 121i.

2.9 Examples of Diagnosis

Figure 11:
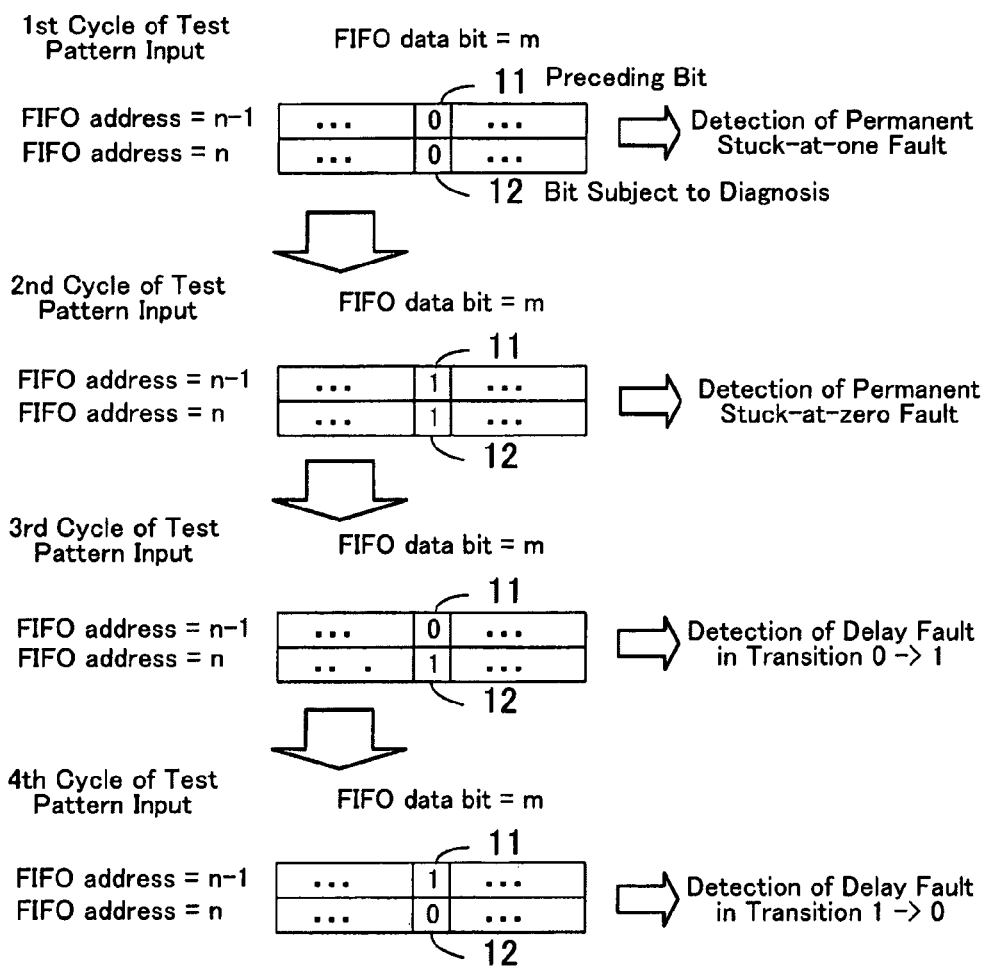
FIG. 11 indicates examples of diagnosis of permanent faults and delay faults in the first embodiment.

Examples of diagnosis of a permanent fault and a delay fault are explained below with reference to FIG. 11, in which examples of diagnosis of permanent faults and delay faults are illustrated. FIG. 11 indicates the operations for diagnosing the m-th bit in the entry area of a FIFO designated by the address "n", where m and n are natural numbers. In FIG. 11, the m-th bit in the entry area at the address "n" (i.e., the bit subject to the diagnosis) is illustrated by the reference "12". In addition, in order to detect a delay fault in the m-th bit in the entry area at the address "n", the m-th bit in the entry area at the preceding address "n−1" is also considered. In FIG. 11, the m-th bit in the entry area at the preceding address "n−1" (i.e., the bit the value of which is read out immediately before the value of the bit subject to the diagnosis) is illustrated by the reference "11". Further, in the operations illustrated in FIG. 11, the value of the zeroth bit (LSB) of the address "n−1" is assumed to be "0".

In the first cycle of writing and reading out the test pattern in and from the FIFO, the values in the test pattern are written in the FIFO as they are (i.e., without inversion). Therefore, in the example illustrated in FIG. 11, the value "0" is written in both of the bit 12 subject to the diagnosis and the preceding bit 11 in the first cycle, so that the writing of the value "0" in the bit 12 subject to the diagnosis enables detection of the permanent stuck-at-one fault in the bit 12. Specifically, when the value "1" is read out from the bit 12 subject to the diagnosis even after the value "0" is written in the bit 12, an ECC error occurs.

In the second cycle of writing and reading'out the test pattern in and from the FIFO, the values in the test pattern are inverted before being written in the FIFO. Therefore, in the example illustrated in FIG. 11, the inverted value "1" is written in both of the bit 12 subject to the diagnosis and the preceding bit 11 in the second cycle, so that the writing of the inverted value "1" in the bit 12 subject to the diagnosis enables detection of the permanent stuck-at-zero fault in the bit 12. Specifically, when the value "0" is read out from the bit 12 subject to the diagnosis even after the inverted value "1" is written in the bit 12, an ECC error occurs.

In the third cycle of writing and reading out the test pattern in and from the FIFO, the value of each bit constituting the test pattern is written as it is (i.e., without inversion) in the FIFO when the value of the zeroth bit (LSB) of the address is "0", and the value of each bit constituting the test pattern is inverted before being written in the FIFO when the value of the zeroth bit (LSB) of the address is "1". Therefore, in the example illustrated in FIG. 11, the values "1" and "0" are respectively written in the bit 12 subject to the diagnosis and the preceding bit 11, so that the writing of the values "1" and "0" respectively in the bit 12 subject to the diagnosis and the preceding bit 11 enables detection of the delay fault in the bit 12 associated with the transition from "0" to "1" in the successive reading of the values of the bits 11 and 12 from the FIFO. That is, in the case where a delay fault exists in the bit 12 subject to the diagnosis, the value "0" is read out from the bit 12 even when the value "1" is written in the bit 12 after the value "0" is written in the preceding bit 11. Therefore, an ECC error occurs.

In the fourth cycle of writing and reading out the test pattern in and from the FIFO, the value of each bit constituting the test pattern is inverted before being written in the FIFO when the value of the zeroth bit (LSB) of the address is "0", and the value of each bit constituting the test pattern is written as it is (i.e., without inversion) in the FIFO when the value of the zeroth bit (LSB) of the address is "1". Therefore, in the example illustrated in FIG. 11, the values "0" and "1" are respectively written in the bit 12 subject to the diagnosis and the preceding bit 11, so that the writing of the values "0" and "1" respectively in the bit 12 subject to the diagnosis and the preceding bit 11 enables detection of the delay fault in the bit 12 associated with the transition from "1" to "0" in the successive reading of the values of the bits 11 and 12 from the FIFO. That is, in the case where a delay fault exists in the bit 12 subject to the diagnosis, the value "1" is read out from the bit 12 even when the value "0" is written in the bit 12 after the value "1" is written in the preceding bit 11. Therefore, an ECC error occurs.

In the example illustrated in FIG. 11, the values of the bits in the test pattern corresponding to the bit 12 subject to the diagnosis (i.e., the m-th bit in the entry area at the address "n") and the preceding bit 11 (i.e., the m-th bit in the entry area at the preceding address "n−1") are assumed to be identical. Therefore, the delay fault can be detected in the third and fourth cycles. However, in the case where the values of the bits in the test pattern corresponding to the bit 12 subject to the diagnosis (i.e., the m-th bit in the entry area at the address "n") and the preceding bit 11 (i.e., the m-th bit in the entry area at the preceding address "n−1") are different, the delay fault can be detected in the first and second cycles. That is, since the combination of inversion and noninversion of the values of successive bits (i.e., bits which are to be read out in succession) are changed as above in the four cycles, the delay fault in the bit 12 subject to the diagnosis can be detected with high reliability regardless of the values of the bits in the test pattern corresponding to the bit 12 subject to the diagnosis and the preceding bit 11.

Although the value of the zeroth bit (LSB) of the address "n−1" is assumed to be "0" in the above explanations with reference to FIG. 11, the delay fault in the bit 12 subject to the diagnosis can be detected in similar manner even in the case where the value of the zeroth bit (LSB) of the address "n−1" is assumed to be "1".

2.10 Error Processing

When the I/O controller (IOC) 121 detects an ECC error in the transmission FIFO 121i, the IOC 121 notifies the service processor (SVP) 131 of the ECC error through the maintenance buses. Then, the SVP 131 performs error processing according to details of the error and the timing of the detection of the error. For example, when an uncorrectable error (UE) is detected by ECC checking during a POST (Power On Self Test) performed before startup of the system, the SVP 131 excludes the faulty LSI from the system before starting the system.

2.11 Inhibition of Inversion

Further, in order to invalidate the function of diagnosing the FIFO, the inversion inhibition flag is provided in the present embodiment. The inversion inhibition flag is controlled by the service processor (SVP) 131 through the maintenance buses. When the inversion inhibition flag is "1", the function of diagnosing the FIFO is invalidated. The SVP 131 sets the inversion inhibition flag to "0" before the test program for diagnosis is executed. If the setting of the inversion inhibition flag is changed while one or more packets are stored in the FIFO, the inversion or noninversion of data in writing and reading the data in and from an entry area of the FIFO designated by an identical address can be differently controlled, so that an ECC error can be erroneously detected. In order to prevent occurrence of such a problem, the SVP 131 sets the inversion inhibition flag after the IOB 120 is powered on before a packet is stored in the FIFO.

3. Second Embodiment

In the second embodiment, the technique for diagnosing a fault in a FIFO is applied to a LIFO (Last-in First-out). The LIFO in the second embodiment is a storage circuit in which ECC-protected data which are later inputted are earlier outputted. For example, LIFO buffers can be used for stack control. In the following explanations, it is assumed that the LIFO in the second embodiment is arranged in an LSI mounted in one of the SBs 110-1, . . . , 110-n and th IOBs 120-1, . . . , 120-n in the server 100 illustrated in FIG. 2.

Figure 12:
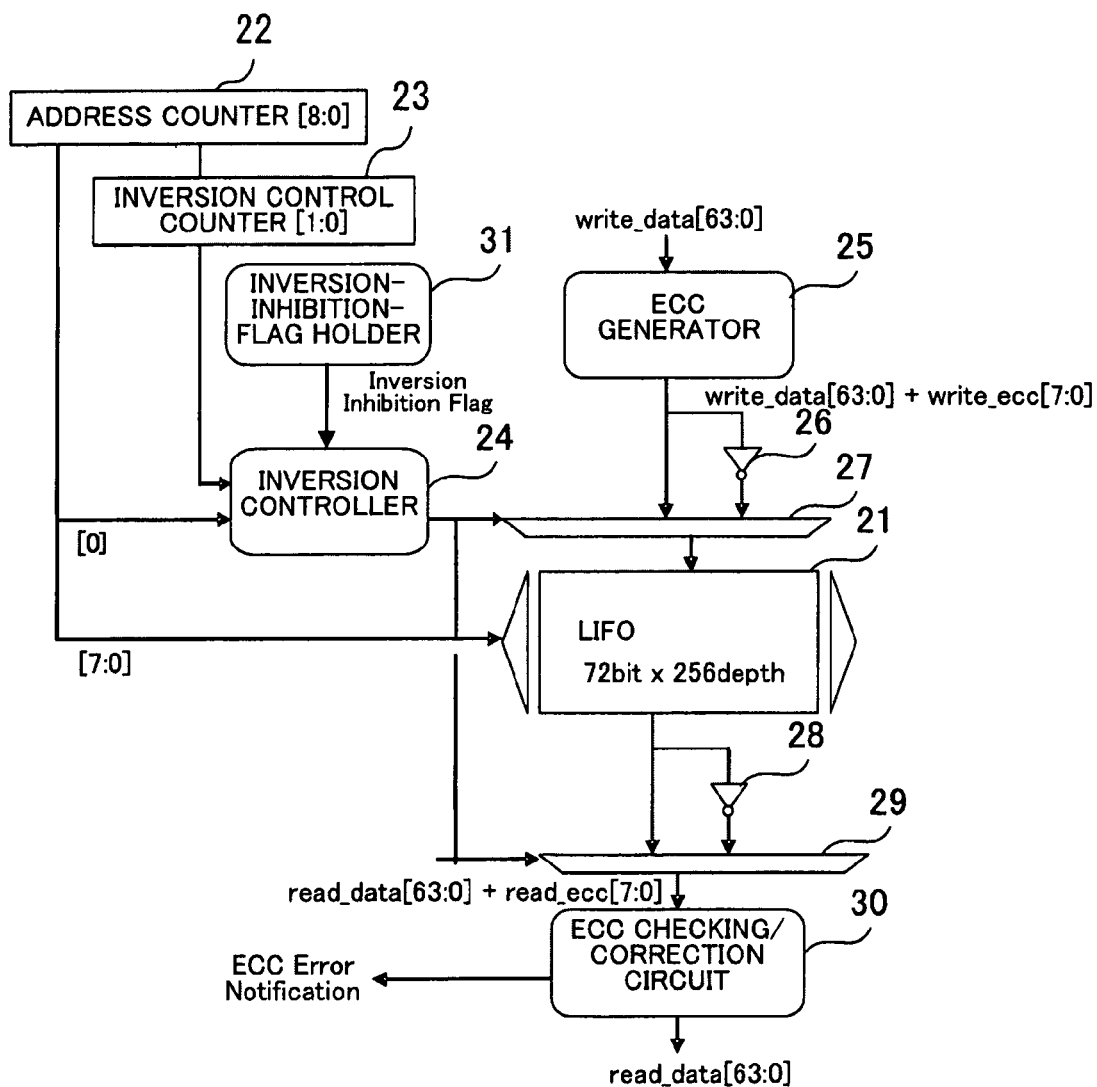
FIG. 12 illustrates an example of an input/output circuit for a LIFO according to a second embodiment.

FIG. 12 illustrates a data input/output circuit for inputting and outputting data into and from a LIFO 21 for diagnosis of the LIFO 21. The data input/output circuit arranged for diagnosis of the LIFO 21 and illustrated in FIG. 12 includes an address counter 22, an inversion control counter 23, an ECC generator 25, an inversion controller 24, selectors 27 and 29, inverters 26 and 28, an ECC checking/correction circuit 30, and an inversion-inhibition-flag holder 31.

Each storage area constituting the LIFO 21 has a bit width of 72 bits, and contains 64-bit data and an 8-bit ECC. The LIFO 21 has a depth of 256. Therefore, the addresses of the 256 storage areas can be represented by eight bits.

The address counter 22 is used in writing and reading in common. The address counter 22 has nine bits.

The seventh to zeroth bits of the address counter 22 represent the address of the LIFO 21. When the count of the address counter 22 is "1FFh" (where "h" stands for hexadecimal notation), the LIFO 21 is empty. When the count of the address counter 22 is "0FFh", the LIFO 21 is full, i.e., data is stored in all the storage areas of the LIFO 21. The initial value of the address counter 22 is "1FFh".

The address counter 22 is incremented by one immediately before writing data, and the data is written in the address after the increment. In addition, when data is read out from the LIFO 21, the address counter 22 is decremented by one. The values of the seventh to zeroth bits of the address counter 22 are inputted into the LIFO 21 as the write address or read address. In addition, the value of the zeroth bit of the address counter 22 is inputted into the inversion controller 24. Further, when the count of the address counter 22 is changed from "000h" to "1FFh" by the decrement by one, the inversion control counter 23 is notified of the timing of the change. The timing of the change from "000h" to "1FFh" is the timing at which the LIFO 21 becomes empty.

The inversion control counter 23 is constituted by two bits. The inversion control counter 23 is incremented by one at the timing at which the LIFO 21 becomes empty. That is, when the inversion control counter 23 receives from the address counter 22 a signal indicating the change from "000h" to "1FFh", the inversion control counter 23 is incremented. The change from "000h" to "1FFh" is the change from the zero address to a negative address. The count of the inversion control counter 23 is inputted into the inversion controller 24.

The inversion controller 24 outputs to the selector 27 an inversion control signal indicating necessity or unnecessity of inversion of data accompanied by an ECC, according to the value of the zeroth bit of the address counter 22 and the count of the inversion control counter 23. In addition, the value of an inversion inhibition flag (of one bit) is inputted from the inversion-inhibition-flag holder 31 to the inversion controller 24. The inversion inhibition flag is set to the inversion-inhibition-flag holder 31 by the service processor (SVP) 131. The inversion inhibition flag is information indicating forced inhibition of the inversion of the data accompanied by an ECC. When an active value (e.g., "1") is set in the inversion inhibition flag, the inversion controller 24 outputs to the selector 27 an inversion control signal indicating unnecessity of inversion, regardless of the values outputted from the address counter 22 and the inversion control counter 23. The relationship between the input and the output of the inversion controller 24 will be explained later with reference to FIG. 13.

The 64-bit write data to be written in the LIFO (write_data [63:0]) is inputted into the ECC generator 25. The ECC generator 25 generates an ECC for the inputted write data. In this example, the 64-bit write data is inputted into the ECC generator 25, and an 8-bit ECC is generated. Then, the write data accompanied by the ECC (write_data[63:0]+write_ecc[7:0]) is outputted from the ECC generator 25.

When data accompanied by an ECC is outputted from the ECC generator 25, the data accompanied by the ECC is inputted into the selector 27 and the inverter 26. The inverter 26 inverts the values of all the bits constituting the inputted data accompanied by the ECC. (That is, the inverter 26 changes the value "0" to "1" and the value "1" to "0".) Then, the inverted data accompanied by the inverted ECC is inputted into the selector 27. The selector 27 selects one of the noninverted data accompanied by the noninverted ECC and the inverted data accompanied by the inverted ECC according to the inversion control signal received from the inversion controller 24, and outputs the selected one to the LIFO 21. Specifically, when the inversion control signal indicates unnecessity of inversion, the selector 27 outputs to the LIFO 21 the noninverted data accompanied by the noninverted ECC. When the inversion control signal indicates necessity of inversion, the selector 27 outputs to the LIFO 21 the inverted data accompanied by the inverted ECC. The LIFO 21 stores the data accompanied by the ECC and outputted from the selector 27 in the entry area designated by the 8-bit address value received from the address counter 22. In addition, the LIFO 21 outputs data accompanied by an ECC and stored in the entry area designated by the 8-bit address value received from the address counter 22. The output data (i.e., the data accompanied by the ECC and outputted from the LIFO 21) is inputted into the selector 29 and the inverter 28. The inverter 28 inverts the values of all the bits constituting the output data containing the ECC and being inputted into the inverter 28. (That is, the inverter 28 changes the value "0" to "1" and the value "1" to "0".) Therefore, in the case where the output data containing the ECC and being outputted from the LIFO 21 is inverted data accompanied by an inverted ECC (i.e., data accompanied by an ECC and inverted by the inverter 26), the inverter 28 is considered to restore the noninverted data accompanied by the noninverted ECC. The output data containing the ECC and being inverted by the inverter 28 is inputted into the selector 29. The selector 29 selects one of the noninverted output data containing the ECC and being outputted from the LIFO 21 and the inverted output data containing the ECC and being outputted from the inverter 28, according to the inversion control signal received from the inversion controller 24, and outputs to the ECC checking/correction circuit 30 the selected output data containing the ECC. Specifically, when the inversion control signal indicates unnecessity of inversion, the selector 29 outputs to the ECC checking/correction circuit the noninverted output data containing the ECC and outputted from the LIFO 21. When the inversion control signal indicates necessity of inversion, the selector 29 outputs to the ECC checking/correction circuit 30 the inverted output data containing the ECC and outputted from the inverter 28 (i.e., the noninverted data accompanied by the noninverted ECC restored by the inversion by the inverter 28). The noninverted output data or the inverted output data outputted from the selector 29 is 72-bit data containing the ECC (read data[63:0]+read ecc[7:0]), where the leading 64 bits constitute the read data, and the following 8 bits constitute the ECC.

The ECC checking/correction circuit 30 checks the ECC in the read data received from the selector 29. When an error is detected by the ECC checking, the ECC checking/correction circuit 30 makes a notification or a correction of the error. Specifically, the ECC checking/correction circuit 30 generates an ECC of the read data, and compares the generated ECC with the ECC received from the selector 29. When the ECC generated by the ECC checking/correction circuit 30 coincides with the ECC received from the selector 29, the ECC checking/correction circuit 30 determines absence of an error, and outputs the read data (read data[63:0]) received from the selector 29. When the ECC generated by the ECC checking/correction circuit 30 does not coincide with the ECC received from the selector 29, the ECC checking/correction circuit 30 detects an error. When the detected error is a correctable error (CE), the ECC checking/correction circuit 30 corrects the read data and outputs the corrected read data. When the detected error is an uncorrectable error (UE), the ECC checking/correction circuit 30 outputs a notification of an ECC error. The notification is transmitted to the SVP 131 in the service processor board (SVPB) 130 through the maintenance bus (M-bus).

Next, the relationship between the input and the output in the inversion controller 24 is explained below. FIG. 13 indicates examples of the inputs into and the outputs from the inversion controller 24. The data inversion in both of data writing and data reading in or from the LIFO 21 is controlled on the basis of the output of the inversion control counter 23, so that the relationship between the input and the output in the inversion controller 24 is identical in the data writing and the data reading.

As indicated in FIG. 13, the value of the inversion inhibition flag, the output of the inversion control counter 23, and the value of the zeroth bit (LSB) of the address counter 22 are inputted into the inversion controller 24. The inversion controller 24 outputs an inversion control signal indicating whether or not data inversion is needed, according to the values inputted as above. When the value of the inversion inhibition flag is "1", the inversion controller 24 outputs, on all occasions, an inversion control signal indicating no inversion. When the value of the inversion inhibition flag is "0", inversion or noninversion is determined according to the output of the inversion control counter 23 and the value of the zeroth bit (LSB) of the address counter 22 as follows.

When the count of the inversion control counter 23 is "00b" (where "b" stands for binary notation), the inversion controller 24 outputs an inversion control signal indicating no inversion regardless of the value of the zeroth bit of the address counter 22. When the count of the inversion control counter 23 is "01b", the inversion controller 24 outputs an inversion control signal indicating inversion regardless of the value of the zeroth bit of the address counter 22. When the count of the inversion control counter 23 is "10b" and the value of the zeroth bit of the address counter 22 is "0", the inversion controller 24 outputs an inversion control signal indicating no inversion. When the count of the inversion control counter 23 is "10b" and the value of the zeroth bit of the address counter 22 is "1", the inversion controller 24 outputs an inversion control signal indicating inversion. When the count of the inversion control counter 23 is "11b" and the value of the zeroth bit of the address counter 22 is "0", the inversion controller 24 outputs an inversion control signal indicating inversion. When the count of the inversion control counter 23 is "11b" and the value of the zeroth bit of the address counter 22 is "1", the inversion controller 24 outputs an inversion control signal indicating no inversion.

The LIFO 21 and the data input/output circuit having the constructions explained above enable detection of the permanent fault and the delay fault. In this case, although the data pattern to be written in the LIFO is generated in accordance with a test program for diagnosis of the LIFO, the data pattern may have random values. However, the size of the data pattern corresponds to the capacity of the LIFO, and the data pattern is to be inputted into the ECC generator 25 four times without changing the arrangement of the values in the test pattern.

In the LIFO 21, 8-byte write data (write data[63:0]) which depends on the test program is written. Unless the LIFO 21 is failed, the values written in the LIFO 21 are read out as the read data (read_data[63:0]).

The test program is described so that the operation of writing and reading of the test pattern in and from the LIFO 21 is performed four times (in four diagnostic cycles). In order to achieve a high fault detection rate, the identical test pattern is used in the four times repetition of writing and reading of the test pattern. The data amount of the test pattern corresponds to the depth of the LIFO 21. As mentioned before, the depth of the LIFO 21 is 256.

For example, in the case where the CPU 111 in the system board (SB) 110 executes the test program, data corresponding to the entire depth of 256 is written in the LIFO 21 under control of the CPU 111, and then all the data written in the LIFO 21 are read out from the LIFO 21 under control of the CPU 111. When the operation of reading out all the data of the test pattern is completed, the operation of writing and reading for diagnosis in the first diagnostic cycle is completed.

When all the data are read out from the LIFO 21 in each diagnostic cycle, the LIFO 21 becomes empty, and the count of the inversion control counter 23 is incremented, so that in the next diagnostic cycle, the same test pattern is written and read out in and from the LIFO 21 under the control based on a value of the count of the inversion control counter 23 which is different from the count of the inversion control counter 23 in the preceding diagnostic cycle. When the operations of writing and reading all the data of the test pattern corresponding to the depth of 256 in four diagnostic cycles are completed, diagnosis of the LIFO 21 with respect to the permanent fault and the delay fault is completed. When a permanent fault or a delay fault is detected during the operations of writing and reading all the data of the test pattern in the four cycles, the ECC checking/correction circuit 30 notifies the SVP 131 in the SVPB 130 of the occurrence of an ECC error.

As in the first embodiment, the inversion inhibition flag is provided for invalidating the function of diagnosing the LIFO 21 in the second embodiment. The inversion inhibition flag is controlled by the SVP 131 through the maintenance buses. When the inversion inhibition flag is "1", the function of diagnosing the LIFO 21 is invalidated. The SVP 131 sets the inversion inhibition flag to "0" before the test program for diagnosis is executed. If the setting of the inversion inhibition flag is changed while data is stored in the LIFO 21, the inversion or noninversion of data in writing and reading the data in and from an entry area of the LIFO 21 designated by an identical address can be differently controlled, so that an ECC error can be erroneously detected. In order to prevent occurrence of such a problem, the SVP 131 sets the inversion inhibition flag after the board on which the LIFO 21 is arranged is powered on before data is stored in the LIFO 21.

As explained above, according to the second embodiment, even the LIFOs (used for stack control) as well as the FIFOs (used for stack control) can be diagnosed with high reliability. Further, any storage apparatus into and from which data is inputted and outputted in a predetermined order can be diagnosed with high reliability.

Incidentally, the number of bits which the inversion control counter 23 needs to have for detecting only the permanent fault in the LIFO is one, and this case needs two diagnostic cycles in each of which the test pattern is written and read in and from the LIFO is two.

4. Advantages of Embodiments

As explained in the first and second embodiments, the provision of the data input/output circuits illustrated in FIGS. 7 and 12 in the LSIs enables fault diagnosis with high reliability regardless of the arrangement of the values in the test pattern. Since it is not needed to care about the arrangement of the values in the test pattern, the test program can be easily produced. In addition, since the operations to be performed are basically only the repetitions of inputting and outputting of the test pattern which is prepared in advance, the description of the test program can be simple. Therefore, the test program can be produced with a small number of man-hours. Further, the high fault detection rate enables detection of a fault in a FIFO or LIFO before the start of operation of the system. Furthermore, the high fault detection rate enables size reduction of the auxiliary logic circuitry for the FIFO or LIFO which is arranged in the LSI.

The storage apparatuses or fault diagnosis method according to the embodiments described in this specification enable fault diagnosis with high reliability regardlessly of data inputted into the storage apparatus and simplify production of a test program.

5. Recording Mediums Storing Program

The processing functions according to each of the first and second embodiments which is performed by using the test program can be realized by a computer. In this case, a program describing details of processing for realizing the functions according to each of the first and second embodiments is provided. When a computer executes the program describing details of processing for realizing the functions according to each of the first and second embodiments, the processing functions can be realized on the computer.

The program describing the details of the processing can be stored in a computer-readable recording medium which can be read by the computer. The computer-readable recording medium may be a magnetic recording device, an optical disk, an optical magnetic recording medium, a semiconductor memory, or the like. The magnetic recording device may be a hard disk drive (HDD), a flexible disk (FD), a magnetic tape, or the like. The optical disk may be a DVD (Digital Versatile Disk), a DVD-RAM (Random Access Memory), a CD-ROM (Compact Disk Read Only Memory), a CD-R (Recordable)/RW (ReWritable), or the like. The optical magnetic recording medium may be an MO (Magneto-Optical Disk) or the like.

In order to put the program into the market, for example, it is possible to sell a portable recording medium such as a DVD or a CD-ROM in which the program is recorded. Alternatively, it is possible to store the program in a storage device belonging to a server computer, and transfer the program to another computer through a network.

The computer which executes the program according each of the first and second embodiments stores the program in a storage device belonging to the computer, where the program is originally recorded in, for example, a portable recording medium, or is initially transferred from the server computer. The computer reads the program from the storage device, and performs processing in accordance with the program. Alternatively, the computer may directly read the program from the portable recording medium for performing processing in accordance with the program. Further alternatively, each computer can sequentially execute processing in accordance with each portion of a program every time the portion of the program is transferred from the server computer.

6. Additional Matters

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions and alterations could be made hereto without departing from the spirit and scope of the invention.

What is claimed is:

1. A storage apparatus for storing and reading data, comprising:
    a storage unit which has a plurality of entry areas and is configured to write data on a basis of a write address designating one of the plurality of entry areas, and to read data on a basis of a read address designating one of the plurality of entry areas;
    a write-address counter which outputs the write address, the write-address counter having a number of bits that is two bits greater than the number of bits used for designating an address in the plurality of entry areas;
    an input-data inverter which inverts input data to be inputted into the storage unit, and outputs the inverted input data;
    an input-data selector which selects one of the input data and the inverted input data on a basis of two most significant bits and a least significant bit of each of write addresses so as to generate four different combinations of non-inverted data and inverted data for writing in pairs of successive entry areas, and writes the one of the input data and the inverted input data in the entry area designated by said each of the write addresses;
    a read-address counter which outputs the read address, the read-address counter having a number of bits that is two bits greater than the number of bits used for designating an address in the plurality of entry areas;
    an output-data inverter which inverts output data outputted from the storage unit, and outputs the inverted output data; and
    an output-data selector which selects and outputs one of the output data and the inverted output data on a basis of two most significant bits and a least significant bit of each of read addresses so as to generate four different combinations of non-inverted data and inverted data as data read from pairs of successive entry areas.

2. The storage apparatus according to claim 1, further comprising an error correction code generator which generates a first error correction code of the input data on a basis of the input data, and attaches the first error correction code to the input data; and an error correction circuit which performs one of error detection in the one of the output data and the inverted output data and error correction of the one of the output data and the inverted output data on a basis of an error correction code contained in the one of the output data and the inverted output data.

3. The storage apparatus according to claim 1, further comprising an inversion-inhibition-flag holder which holds an inversion inhibition flag; wherein the input-data selector inhibits selection of the inverted input data on a basis of the inversion inhibition flag, and the output-data selector inhibits selection of the inverted output data on the basis of the inversion inhibition flag.

4. The storage apparatus according to claim 1, wherein the storage apparatus realizes a first-in first-out buffer.

5. The storage apparatus according to claim 4, wherein the input-data selector selects the input data when the two most significant bits of the write address respectively have values "0" and "0", selects the inverted input data when the two most significant bits of the write address respectively have values "0" and "1", selects the input data when the two most significant bits of the write address respectively have values "1" and "0" and the least significant bit of the write address has a value "0", selects the inverted input data when the two most significant bits of the write address respectively have values "1" and "0" and the least significant bit of the write address has a value "1", selects the inverted input data when the two most significant bits of the write address respectively have values "1" and "1" and the least significant bit of the write address has a value "0", and selects the input data when the two most significant bits of the write address respectively have values "1" and "1" and the least significant bit of the write address has a value "1"; and the output-data selector selects the output data when the two most significant bits of the read address respectively have values "0" and "0", selects the inverted output data when the two most significant bits of the read address respectively have values "0" and "1", selects the output data when the two most significant bits of the read address respectively have values "1" and "0" and the least significant bit of the read address has a value "0", selects the inverted output data when the two most significant bits of the read address respectively have values "1" and "0" and the least significant bit of the read address has a value "1", selects the inverted output data when the two most significant bits of the read address respectively have values "1" and "1" and the least significant bit of the read address has a value "0", and selects the output data when the two most significant bits of the read address respectively have values "1" and "1" and the least significant bit of the read address has a value "1".

6. The storage apparatus according to claim 4, wherein the write-address counter has bits, a number of which is two bits greater than a number of bits needed for representing addresses of all of the plurality of entry areas, and outputs the bits of the write-address counter other than the two most significant bits of the write address, and the read-address counter has bits, the number of which is two bits greater than the number of bits needed for representing the addresses of all of the plurality of entry areas, and outputs the bits of the read-address counter other than the two most significant bits of the read address.

7. A fault diagnosis method for diagnosing a storage device having a plurality of entry areas, comprising:
    determining whether or not input data is to be inverted, on a basis of two most significant bits and a least significant bit of each of write addresses outputted from a write-address counter so as to generate four different combinations of non-inverted data and inverted data for writing in pairs of successive entry areas, the write-address counter having a number of bits that is two bits greater than a number of bits used for designating an address in the plurality of entry areas;
    writing the input data in one of the plurality of entry areas which is designated by a corresponding one of the write addresses when the input data is determined not to be inverted;
    inverting the input data and writing the inverted input data in the one of the plurality of entry areas which is designated by a corresponding one of the write addresses when the input data is determined to be inverted;

determining whether or not output data is to be inverted, on a basis of two most significant bits and a least significant bit of each of read addresses outputted from a read-address counter so as to generate four different combinations of non-inverted data and inverted data as data read from pairs of successive entry areas, the read-address counter having a number of bits that is two bits greater than the number of bits used for designating an address in the plurality of entry areas;

reading the output data from one of the plurality of entry areas which is designated by said each of the read addresses;

outputting the output data as it is when the output data is determined not to be inverted; and inverting the output data and outputting the inverted output data when the output data is determined to be inverted.

8. The fault diagnosis method according to claim 7, wherein the write-address counter has one or more first bits needed for representing addresses of all of the plurality of entry areas and a first control bit which is more significant than the one or more first bits, the first control bit is used as the two most significant bits of said each of the write addresses in the determining whether or not the input data is to be inverted, the read-address counter has one or more second bits needed for representing addresses of all of the plurality of entry areas and a second control bit which is more significant than the one or more second bits, and the second control bit is used as the two most significant bits of said each of the read addresses in the determining whether or not the output data is to be inverted.

9. The fault diagnosis method according to claim 7, wherein the write-address counter has one or more first bits needed for representing addresses of all of the plurality of entry areas and two first control bits which are more significant than the one or more first bits, the first control bits and a least significant bit of the one or more first bits are used as the two most significant bits of said each of the write addresses in the determining whether or not the input data is to be inverted, the read-address counter has one or more second bits needed for representing addresses of all of the plurality of entry areas and two second control bits which are more significant than the one or more second bits, and the second control bits and a least significant bit of the one or more second bits are used as the two most significant bits of said each of the read addresses in the determining whether or not the output data is to be inverted.

* * * * *